United States Patent
Keith

(10) Patent No.: US 8,220,881 B2
(45) Date of Patent: Jul. 17, 2012

(54) CABLE MANAGEMENT SYSTEMS HAVING ACCESS DOORS CONNECTED THERETO VIA LATCH/HINGE ASSEMBLIES

(75) Inventor: Scott Martin Keith, Plano, TX (US)

(73) Assignee: CommScope, Inc., Hickory, NC (US)

( * ) Notice: Subject to any disclaimer, the term of this patent is extended or adjusted under 35 U.S.C. 154(b) by 880 days.

(21) Appl. No.: 12/268,721

(22) Filed: Nov. 11, 2008

(65) Prior Publication Data
US 2009/0121092 A1 May 14, 2009

Related U.S. Application Data

(60) Provisional application No. 60/987,140, filed on Nov. 12, 2007.

(51) Int. Cl.
*A47B 88/00* (2006.01)
(52) U.S. Cl. ............ 312/324; 312/265.1; 312/326; 312/329; 312/223.1; 49/193; 49/382
(58) Field of Classification Search ............ 49/193, 49/382; 211/26; 312/265.1, 324, 326, 329, 312/223.1; 16/268
See application file for complete search history.

(56) References Cited

U.S. PATENT DOCUMENTS

| | | | | |
|---|---|---|---|---|
| 331,466 A | * | 12/1885 | Whitney | 16/230 |
| 707,910 A | * | 8/1902 | Fischer et al. | 16/230 |
| 1,550,205 A | * | 8/1925 | Cemazar | 16/230 |
| 2,195,991 A | * | 4/1940 | Lovett | 16/230 |
| 1,896,009 A | | 7/1959 | Caveney | |
| 3,048,898 A | * | 8/1962 | Davis | 49/193 |
| 3,403,473 A | * | 10/1968 | Navarro | 49/193 |
| 3,515,086 A | | 6/1970 | Sigman et al. | |
| 3,889,419 A | * | 6/1975 | Maleck | 49/193 |

(Continued)

FOREIGN PATENT DOCUMENTS
JP 02304186 A * 12/1990
(Continued)

OTHER PUBLICATIONS

International Search Report and Written Opinion (14 pages) corresponding to International Application No. PCT/US2008/012690; Mailing Date: Feb. 25, 2009.

(Continued)

*Primary Examiner* — Jerry Redman
(74) *Attorney, Agent, or Firm* — Myers Bigel Sibley & Sajovec

(57) ABSTRACT

Communications cable management systems include a cable trough and a door that is configured to provide access to the cable trough. A first latch structure is attached to the door that includes a first latch and a second latch. A second latch structure is attached to the door that includes a third latch and a fourth latch. The systems also include a support structure that has first through fourth latch receiving assemblies that are configured to receive the respective first through fourth latches. The first through fourth latch receiving assemblies may comprise hinge brackets and/or pivotable latch members. The first and second latches and their corresponding first and second latch receiving assemblies are each configured to act as a hinge when the third and fourth latches are removed from their corresponding latch receiving assemblies. Similarly, the third and fourth latches and their corresponding third and fourth latch receiving assemblies are each configured to act as a hinge when the first and second latches are removed from their corresponding latch receiving assemblies.

17 Claims, 24 Drawing Sheets

U.S. PATENT DOCUMENTS

| | | | |
|---|---|---|---|
| 4,466,676 A * | 8/1984 | Nilsson | 312/283 |
| 4,503,582 A * | 3/1985 | Gurubatham | 16/232 |
| 5,064,255 A * | 11/1991 | Inui et al. | 312/405 |
| 5,357,652 A * | 10/1994 | Yamada | 16/232 |
| 5,546,495 A | 8/1996 | Bruckner et al. | |
| 5,548,927 A * | 8/1996 | Song | 49/193 |
| 5,675,934 A * | 10/1997 | Park | 49/193 |
| 5,697,121 A * | 12/1997 | Early | 16/231 |
| 5,829,197 A * | 11/1998 | Oh | 49/193 |
| 5,911,264 A | 6/1999 | Smrke et al. | |
| 5,926,916 A * | 7/1999 | Lee et al. | 16/230 |
| 6,011,221 A | 1/2000 | Lecinski et al. | |
| 6,118,075 A | 9/2000 | Baker et al. | |
| 6,504,094 B2 | 1/2003 | Woo et al. | |
| 6,968,647 B2 * | 11/2005 | Levesque et al. | 49/192 |
| 7,178,292 B2 * | 2/2007 | Yamada | 49/193 |
| 7,194,181 B2 | 3/2007 | Holmberg et al. | |
| 7,385,141 B2 * | 6/2008 | Keith et al. | 174/135 |
| 7,518,863 B2 * | 4/2009 | Wayman et al. | 361/690 |
| 7,999,183 B2 * | 8/2011 | Garza et al. | 174/100 |
| 2003/0020379 A1 | 1/2003 | Larsen et al. | |
| 2004/0105219 A1 | 6/2004 | McClellan et al. | |
| 2005/0115152 A1 | 6/2005 | Levesque et al. | |
| 2006/1023737 | 10/2006 | Smith et al. | |
| 2007/0175654 A1 | 8/2007 | Keith et al. | |
| 2007/0210681 A1 | 9/2007 | Adducci et al. | |
| 2009/0139145 A1 * | 6/2009 | Watanabe et al. | 49/193 |

FOREIGN PATENT DOCUMENTS

WO    WO 2005/112477 A    11/2005

OTHER PUBLICATIONS

Examiner's Report No. 2 on Australian Patent Application No. 2007211866, May 7, 2010, 3 pages.

Supplemental European Search Report corresponding to European Application No. EP 07 76 2998; Mailing Date: Aug. 26, 2009.

International Search Report and the Written Opinion of the International Searching Authority for PCT Application No. PCT/US07/02652, mailed Nov. 19, 2007.

Chatsworth Products, Inc., MCS-EFX Master Cabling Section Extended Fingers, 2004, 2 pages.

Photographs of Chatsworth Products, Inc., MCS-EFS Master Cabling Section, 5 pages.

* cited by examiner

CABLE MANAGEMENT SYSTEMS HAVING ACCESS DOORS CONNECTED THERETO VIA LATCH/HINGE ASSEMBLIES

CROSS REFERENCE TO RELATED APPLICATION

This application claims priority from U.S. Provisional Patent Application Ser. No. 60/987,140, filed Nov. 12, 2007, entitled LATCH BAR AND PIN ASSEMBLY, the disclosure of which is hereby incorporated herein by reference in its entirety.

FIELD OF THE INVENTION

The present invention relates generally to cable management systems and, more particularly, to cable management systems that include access doors.

BACKGROUND

Communications cable management systems are commonly used to route, arrange and manage communications cables. Such communications cable management systems may be used on, or in conjunction with, communications racks, cabinets, terminal block panels and the like. Terminal block panels (e.g., modular patch panels, IDC based patch panels and/or 110 style systems) are hardware devices that are used in the communication equipment industry to connect cables to terminal equipment. These terminal block panels are typically mounted on a wall of a communications closet or computer room. Exemplary panels contain a securing surface that is affixed to the wall, and a mounting surface upon which connecting devices such as connecting blocks are secured. The connecting blocks interface with data carrying cables, such as exterior cables that route data to and from the communications closet/computer room, to cables connected to, for example, the terminal devices.

In some cases, two or more back panels are mounted in a side-by-side, spaced apart arrangement. A spacer bracket is mounted in the space between the back panels. The spacer bracket may be secured to the wall and/or to one or both of the back panels. The spacer bracket defines a cord trough through which cords may be routed that connect connection blocks of one of the back panels with connection blocks of the other back panel. In some cases, a door panel is mounted on the spacer bracket to protect and hide the cords in the cord trough. Stand alone communications cable management cabinets are also provided that may similarly include one or more door panels that protect and hide the cords and cables that are routed through a cord trough in the interior of the cabinet.

According to one known construction available from Chatsworth Products, Inc., the door panel is secured to the spacer bracket by four plastic quarter turn fasteners located along each side edge of the door panel. The door panel can be removed by releasing (i.e., by turning to an open position) all four fasteners. Alternatively, the user may release the two fasteners on either side, and pivot the door panel about the other two plastic fasteners. U.S. Pat. No. 7,385,141, which is assigned to the assignee of the present application, discloses further door panel arrangements for communications cable management systems.

SUMMARY

Pursuant to embodiments of the present invention, communications cable management systems are provided which comprise a cable trough that has a front side that is at least partially exposed. A door is provided that covers at least a portion of the exposed front side of the cable trough. First and second latches are attached to the door, and a support structure on which the door is mounted includes corresponding first and second latch receiving assemblies. Each of the latch receiving assemblies may be at least partially moveable (e.g., a portion of the latch receiving assembly may move when engaged by its corresponding latch). The first and second latches are each selectively positionable between a latched position in which the latch is received in its respective latch receiving assembly to secure the door to the support structure for pivotal movement about respective first and second pivot axes, and an unlatched position in which the latch is removed from its respective latch receiving assembly to permit the respective edge of the door to be separated from the support structure.

In some embodiments, the first latch receiving assembly may comprise a first hinge bracket that includes a first opening that is configured to receive the first latch, and the second latch receiving assembly may comprise a second hinge bracket that includes a second opening that is configured to receive the second latch. In such embodiments, the first and second hinge brackets may each have a mounted portion that is fixedly mounted to the support structure and an elastically mobile portion that includes an opening. Each hinge bracket may also include a striker plate that is positioned between a front surface of the door and the opening on the hinge bracket. These striker plates may be positioned so as to define an acute angle with respect to a longitudinal axis of the latch that is to be received within the hinge bracket. The striker plates may be part of the elastically mobile portion of each hinge bracket so that the mating latch forces the striker plate upwardly until the mating latch is received within the opening in the hinge bracket when the door is moved from an open position to a fully closed position.

In other embodiments, each latch receiving assembly may comprise a support member (which may, for example, be part of the support stricture) that includes a slot that has an opening that is configured to receive its mating latch and a latch member that is pivotable between a first position in which the latch member captures the mating latch within the slot and a second position in which the latch member pivots away from the slot opening. These latch receiving assemblies may also include a spring that biases the latch member toward the first position.

In the above-described systems, the support structure may further include third and fourth latch receiving assemblies and third and fourth latches (so that at least a total of four latch receiving assemblies are provided per door). The third and fourth latches may each be selectively positionable between a latched position in which the latch is received in its respective latch receiving assembly to secure the door to the support structure for pivotal movement about the respective first and second pivot axes, and an unlatched position in which the latch is removed from its respective latch receiving assembly to permit the respective edge of the door to be separated from the support structure. Accordingly, when the first, second, third and fourth latches are in their latched positions, the door is secured in a closed position on the support structure. When the first, second, third and fourth latches are in their unlatched positions, the door can be removed from the support structure. When the first and third latches are in their latched positions and the second and fourth latches are in their unlatched positions, the door can be pivoted open about the first pivot axis. Finally, when the second and fourth latches are in their latched positions and the first and third latches are in their unlatched positions, the door can be pivoted open about the second pivot axis.

The systems may also include a first actuator that is operable by a user to selectively move the first and third latches from their latched positions to their unlatched positions and a second actuator that is operable by a user to selectively move the second and fourth latches from their latched positions to their unlatched positions.

Pursuant to further embodiments of the present invention, communications cable management systems are provided that include a cable trough and a door that is configured to provide access to the cable trough. A first latch structure is attached to the door that includes a first latch and a second latch. A second latch structure is likewise attached to the door that includes a third latch and a fourth latch. The system also includes a support structure that includes first through fourth latch receiving assemblies that are configured to receive the respective first through fourth latches. The first and second latches and their corresponding first and second latch receiving assemblies are each configured to act as a hinge when the third and fourth latches are removed from their corresponding latch receiving assemblies. Similarly, the third and fourth latches and their corresponding third and fourth latch receiving assemblies are each configured to act as a hinge when the first and second latches are removed from their corresponding latch receiving assemblies.

In some embodiments, each latch receiving assembly may comprise a hinge bracket that includes an opening that is configured to receive a mating latch. Each hinge bracket may include a mounted portion that is fixedly mounted to the support structure and an elastically mobile portion that includes the opening. Each of the hinge brackets may include a striker plate that is positioned so as to define an acute angle with respect to a longitudinal axis defined by its mating latch. In other embodiments, each of the first through fourth latch receiving assemblies may comprise a bracket that includes a slot that has an opening that is configured to receive a respective one of the first through fourth latches and a latch member that has an arm that is moveable between a first position in which the arm captures the respective one of the first through fourth latches within the slot and a second position in which the arm allows access to the slot. In such embodiments, each latch receiving assembly may also include a spring that biases the arm of the latch member toward the first position.

DETAILED DESCRIPTION

Figure 1:
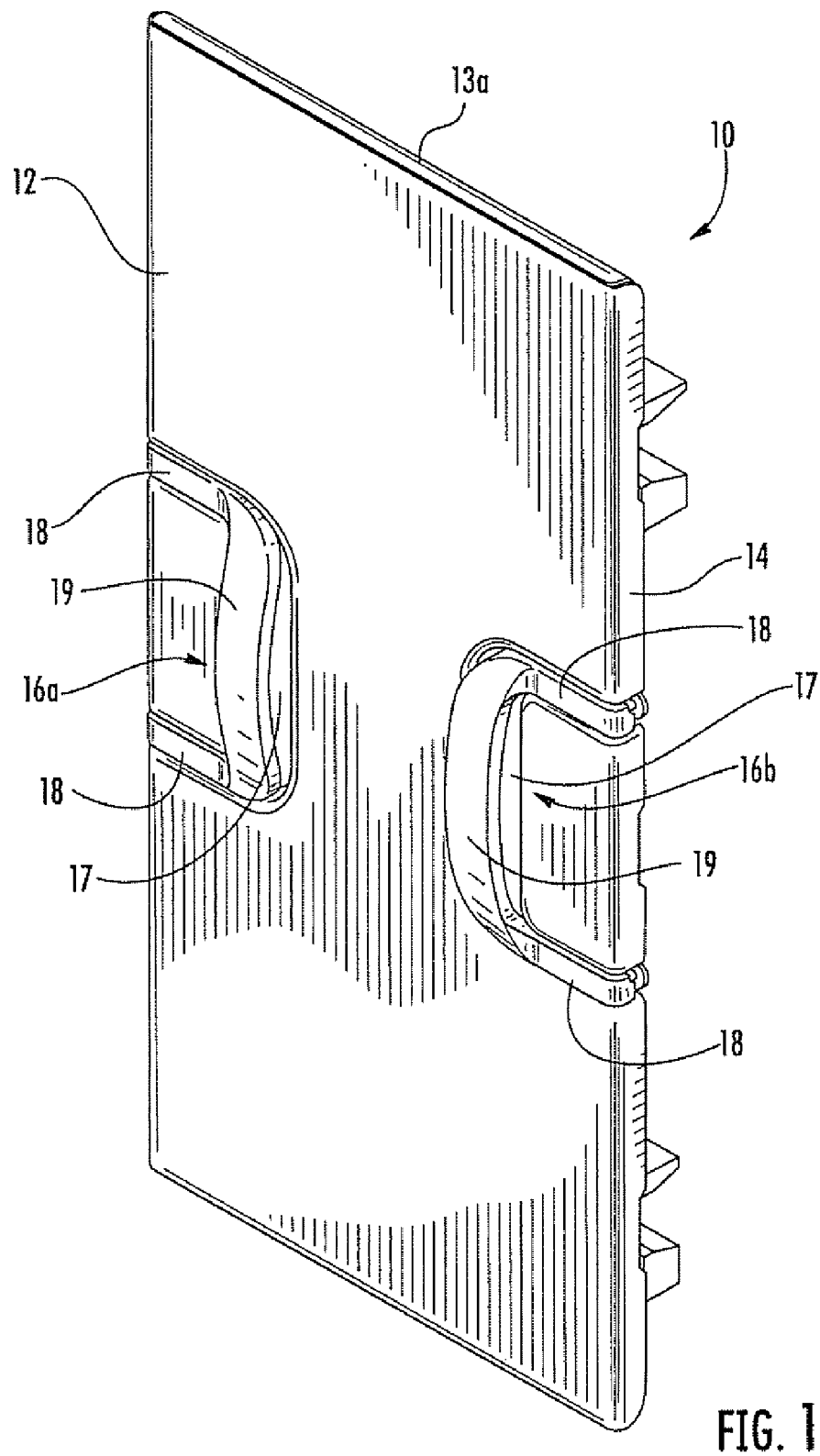
FIG. 1 is a front perspective view of a door assembly for a communications rack, cabinet or wall-mounted system according to embodiments of the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout. Thicknesses and dimensions of some components may be exaggerated for clarity.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and "including" when used in this specification, specify the presence of stated features, elements, and/or components, but do not preclude the presence or addition of one or more other features, elements, components, and/or groups thereof. As used herein the expression "and/or" includes any and all combinations of one or more of the associated listed items.

It will be understood that when an element is referred to as being "coupled," "connected," "attached" or "mounted" to another element, it can be directly coupled, connected attached or mounted to the other element or intervening elements may also be present. In contrast, when an element is referred to as being "directly" coupled, connected, attached or mounted to another element, there are no intervening elements present.

In addition, spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

In accordance with embodiments of the present invention, communications cable management systems are provided that include door assemblies. The communications cable management systems may comprise, for example, one or more communications racks, cabinets or wall-mounted systems upon which one or more door assemblies are mounted.

FIGS. 1-12 illustrate a door assembly 10 that may be part of a communications rack, cabinet or wall-mounted system according to certain embodiments of the present invention. As shown in FIG. 1, the door assembly 10 may include a substantially planar door body 12 that has a top lip 13a, a bottom lip 13b, and side lips 14. Some or all of the lips 13a, 13b, 14 could alternatively be side edges of the door body 12. Handles 16a, 16b may be attached at the side lips 14 and fit within recesses 17 in the door body 12. The handles 16a, 16b may be generally U-shaped, having two arms 18 that are bridged by a bi-arcuate grasping portion 19 that protrudes away from the door body 12 to facilitate grasping by a user. The handles 16a, 16b may be mirror images of each other, and hence only handle 16a is described below.

Figure 2:
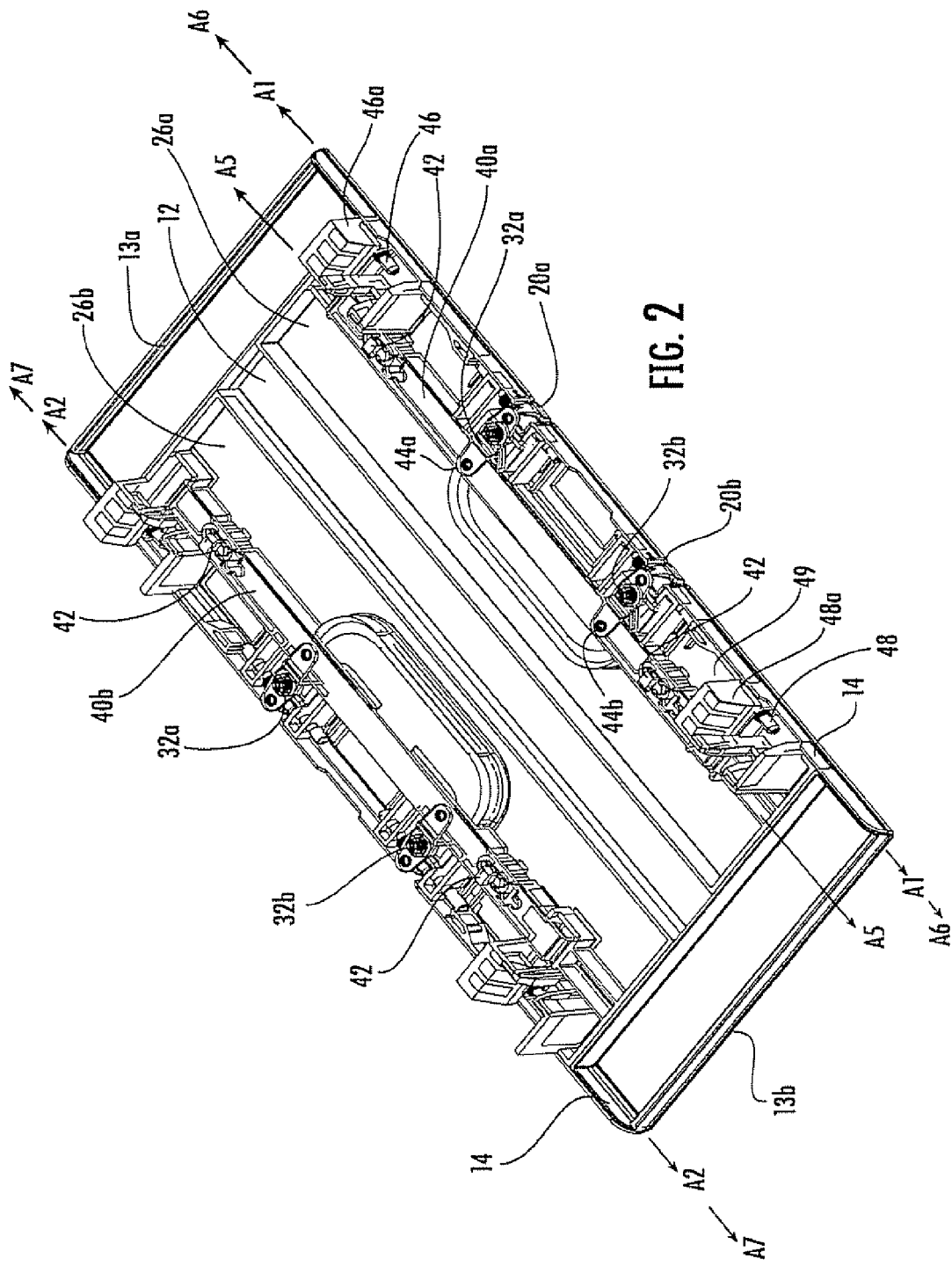
FIG. 2 is a rear perspective view of the door assembly of FIG. 1.
Figure 3:
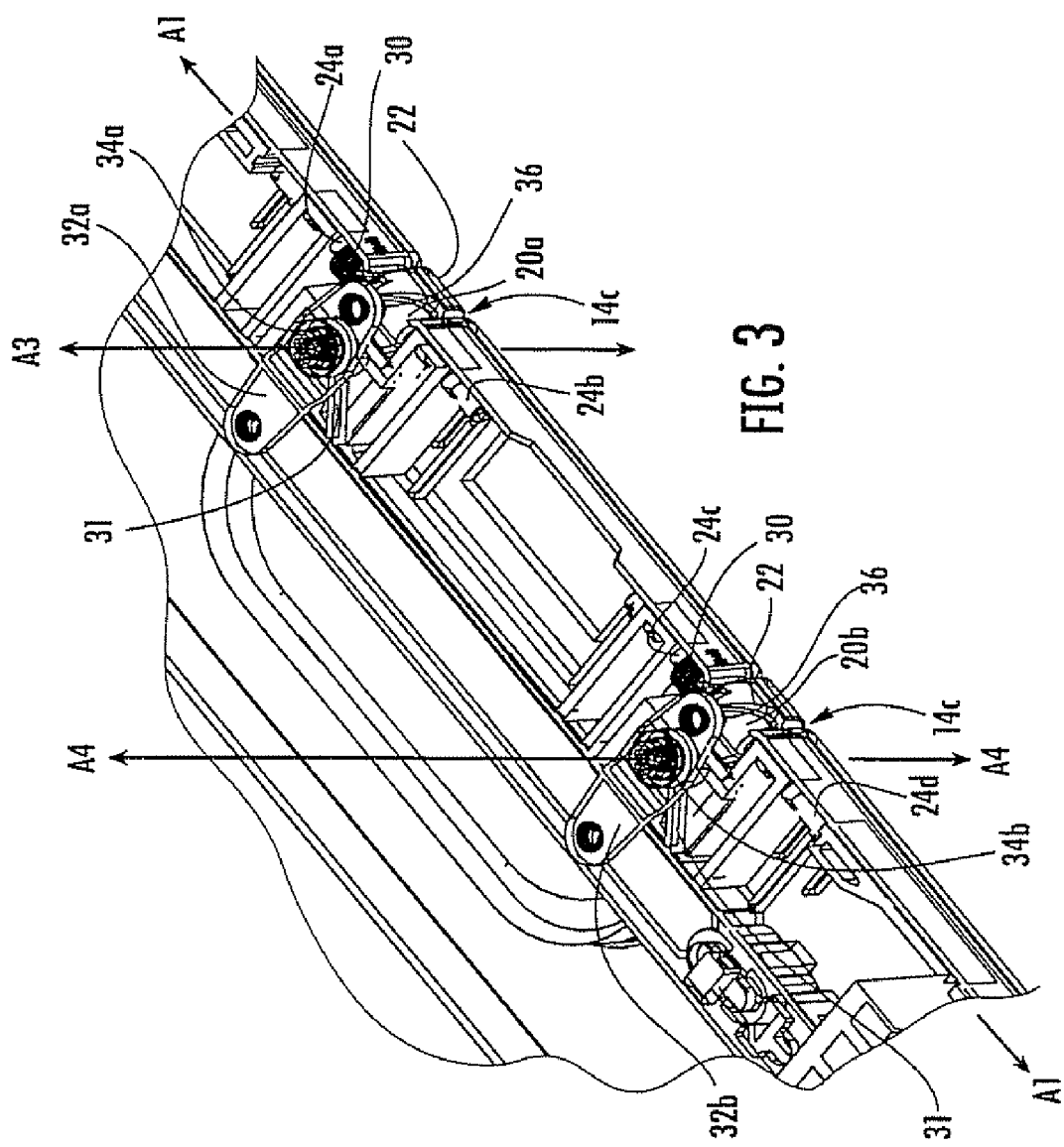
FIG. 3 is an enlarged rear perspective view of the door assembly of FIG. 1 showing the handle and surrounding area.

As shown in FIGS. 2 and 3, handle 16a includes a pivot base 20a, 20b at the end of each respective arm 18. The pivot bases are located in recesses 14c in the side lips 14. Each pivot base 20a, 20b includes a cammed surface 22 that wraps helically around the pivot base 20a, 20b to form a helical ramp that faces downwardly. Handle pins 24a, 24b extend vertically from opposite ends of the pivot base 20a, and handle pins 24c, 24d extend from opposite ends of the pivot base 20b; together, the handle pins 24a, 24b, 24c, 24d define a door pivot axis A1 (a second pivot axis A2 is defined by the handle pins 24a, 24b, 24c, 24d on the opposite side handle 16b). In the illustrated embodiment, the handle 16a is formed as a unitary member, with the pivot bases 20a, 20b and the handle pins 24a-24d being formed integrally with the remainder of the handle 16a.

Figure 4:
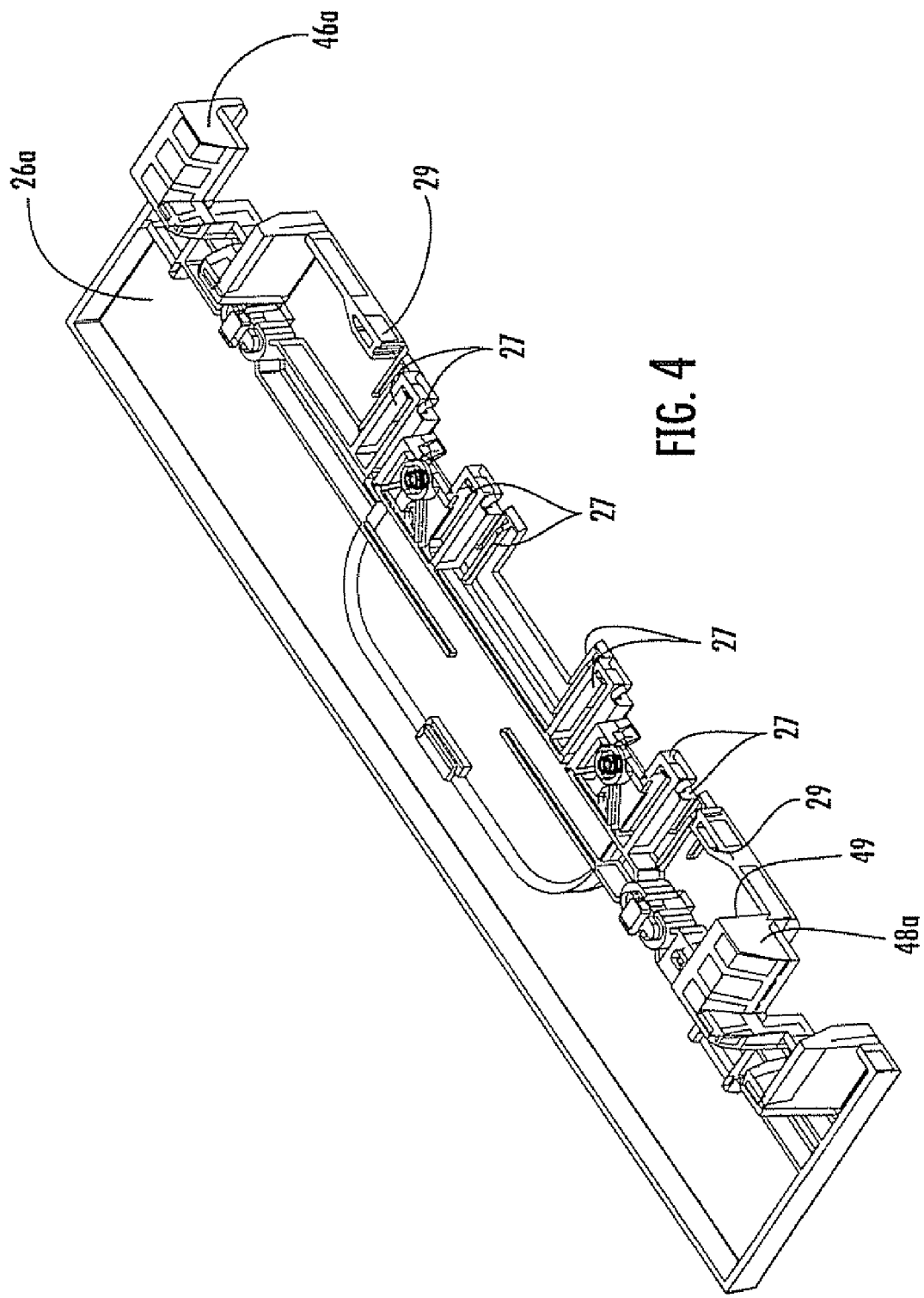
FIG. 4 is a rear perspective view of a backplate of the door assembly of FIG. 1.

Referring now to FIGS. 2 and 4, two mirror image back plates 26a, 26b (only back plate 26a will be described in detail herein) are mounted on and/or adjacent the rear surface of the door body 12 (typically to the rear surface of the door body 12 or to the side lips 14) via adhesive, threaded fasteners or the like. The back plates 26a, 26b, which can help to provide stiffness to the door assembly 10, may be generally planar. The back plates 26a, 26b may include a number of projections, flanges, bosses, and the like. In some embodiments, a single back plate may be employed, or the back plates may be omitted entirely.

Referring again to FIGS. 2 and 4, near its lateral edge, the back plate 26a includes a series of ribs 27 that have apertures (not shown) that receive the handle pins 24a-24d of the associated handle 16a. Also, two stops 29 are positioned to rest against the ends of the handle pins 24a, 24d to maintain the handle 16a in place. A spring 30 (FIG. 3) surrounds each of the handle pins 24a, 24c and is mounted to a rib 27 to bias the handle 16a toward a closed position, in which the handle 16a resides in the recess 17 of the door body 12.

Referring back to FIGS. 2 and 3, each of two toggle arms 32a, 32b are pivotally attached to a mounting platform 31 on each back plate 26a, 26b at, respectively, pivots 34a, 34b, such that the toggle arms 32a, 32b can rotate about respective axes A3, A4 that are normal to the door body 12. At its lateral end, each toggle arm 32a, 32b includes a cam interface post 36 that extends toward and contacts the cammed surface 22 of the adjacent pivot base 20a, 20b of the handle 16a.

Figure 5:
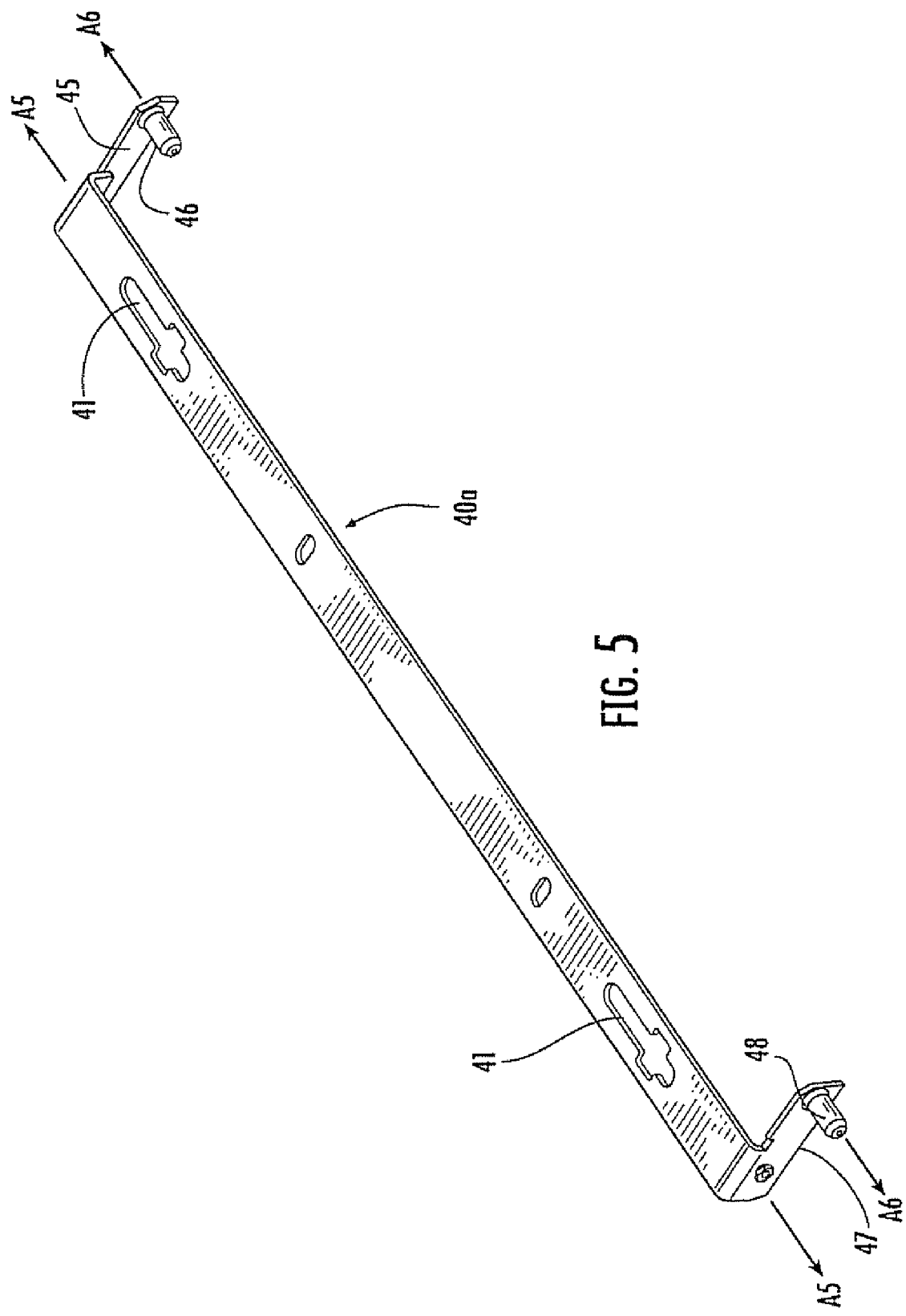
FIG. 5 is a rear perspective view of a latch bar of the door assembly of FIG. 1.

Referring now to FIGS. 2 and 5, two generally vertically-disposed mirror image latch bars 40a, 40b (only one of which, latch bar 40a, will be described herein) are positioned inboard of the handles 16a, 16b, each overlying a portion of its respective back plate 26a, 26b. The latch bar 40a includes mounting apertures 41 that receive latch bar retainers 42 that project from the back plate 26a. The mounting apertures 41 are of sufficient length that the latch bar 40a can move vertically over a short distance along an axis A5. The latch bar 40a includes a top flange 45 that extends laterally from the upper end of the latch bar 40a. A latch structure in the form of a latch pin 46 extends downwardly from the top flange 45. The latch pin 46 is received in an aperture or compartment defined in a locator or guide feature 46a that protrudes from the back of the back plate 26a. Similarly, a bottom flange 47 extends laterally from the lower end of the latch bar 40a, and a latch structure in the form of a latch pin 48 extends downwardly therefrom through an aperture or compartment in a locator feature 48a that protrudes from the back of the back plate 26b. Together the pins 46, 48 define a pivot axis A6 on which the door assembly 10 can pivot (the pins 46, 48 connected to the latch bar 40b define a pivot axis A7 on the opposite side of the door assembly 10). The upper surface of the bottom flange 47 contacts a spring (not shown) that also contacts a rib 49. The spring is in compression and urges the latch bar 40a downwardly. The latch bar 40a is pivotally attached to each of the toggle arms 32a, 32b at respective pivots 44a, 44b.

Figure 6:
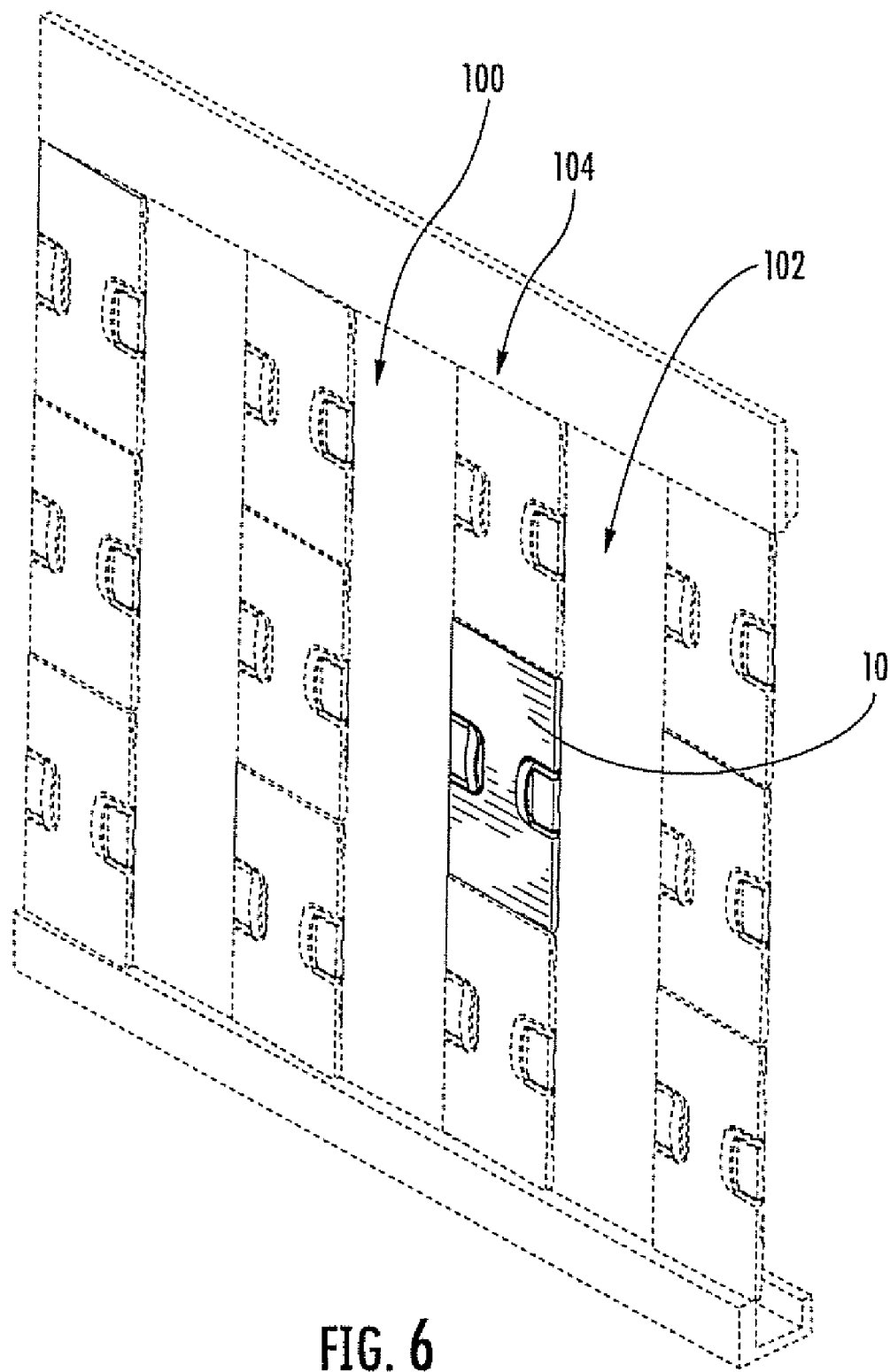
FIG. 6 is a perspective view of the door assembly of FIG. 1 in position in a wall-mounted communications system.
Figure 7:
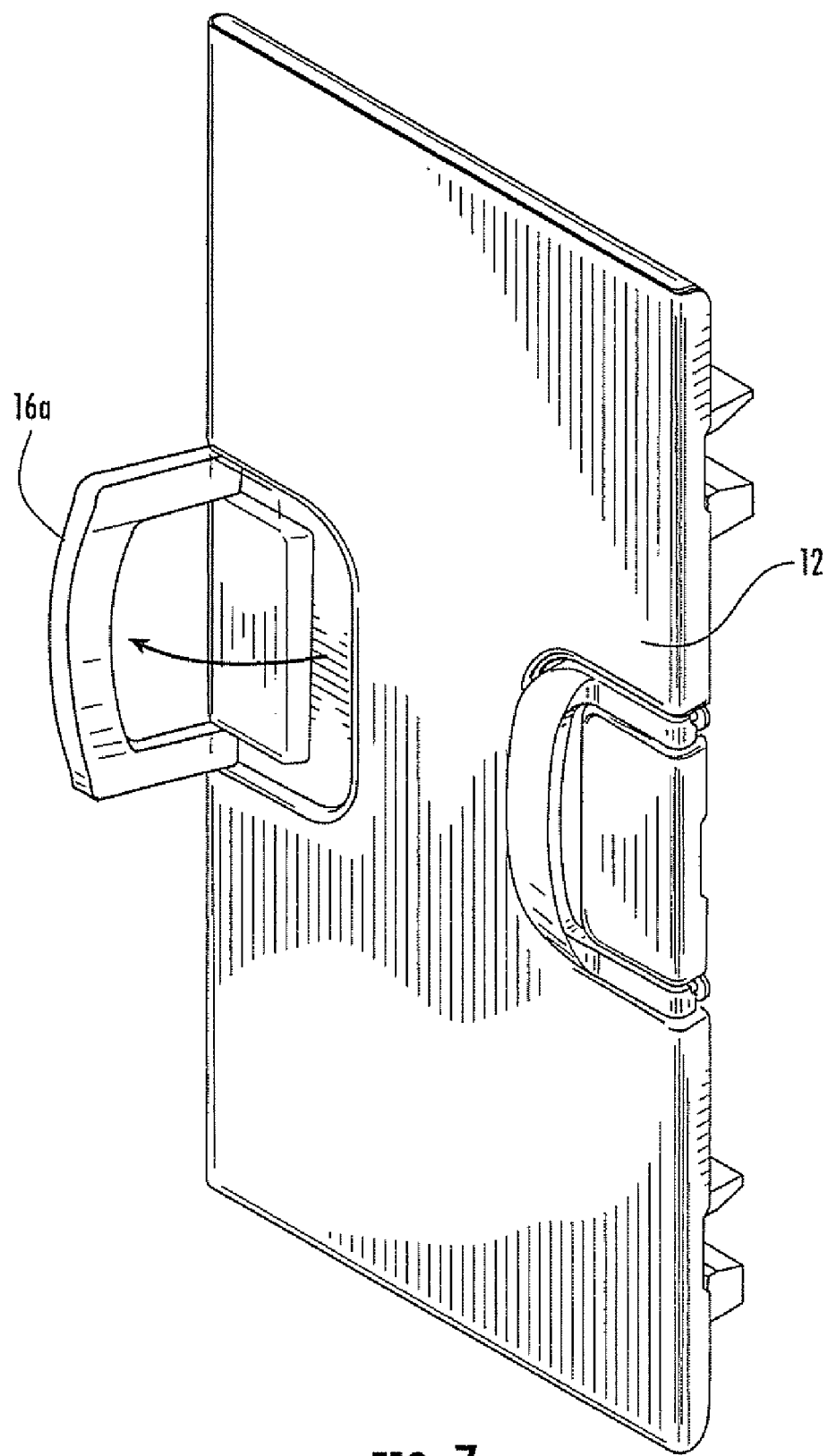
FIG. 7 is a front perspective view of a handle of the door assembly or FIG. 6 in an extended position.
Figure 8:
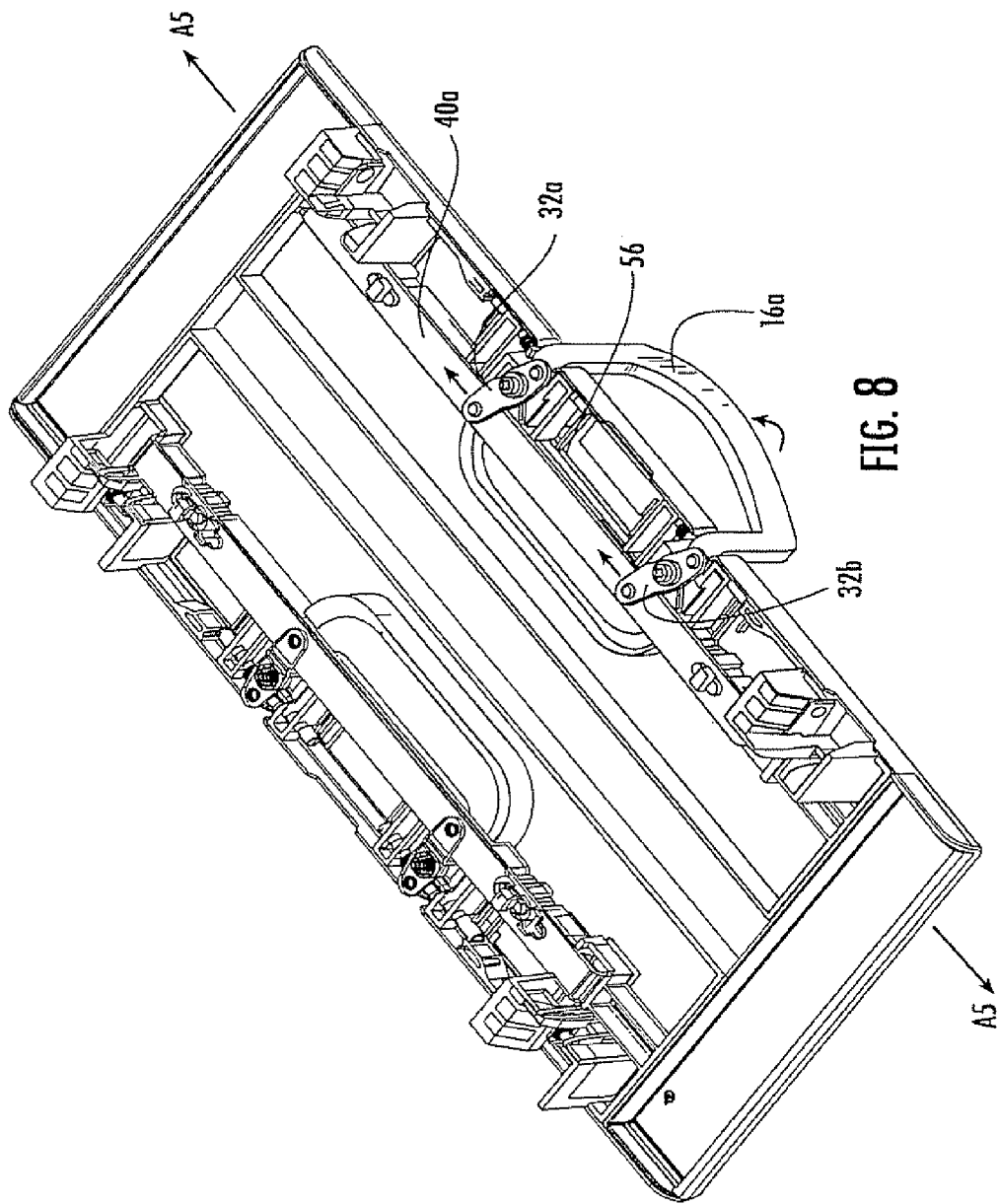
FIG. 8 is a rear perspective view of the door assembly of FIG. 7 with the handle in an extended position.
Figure 9:
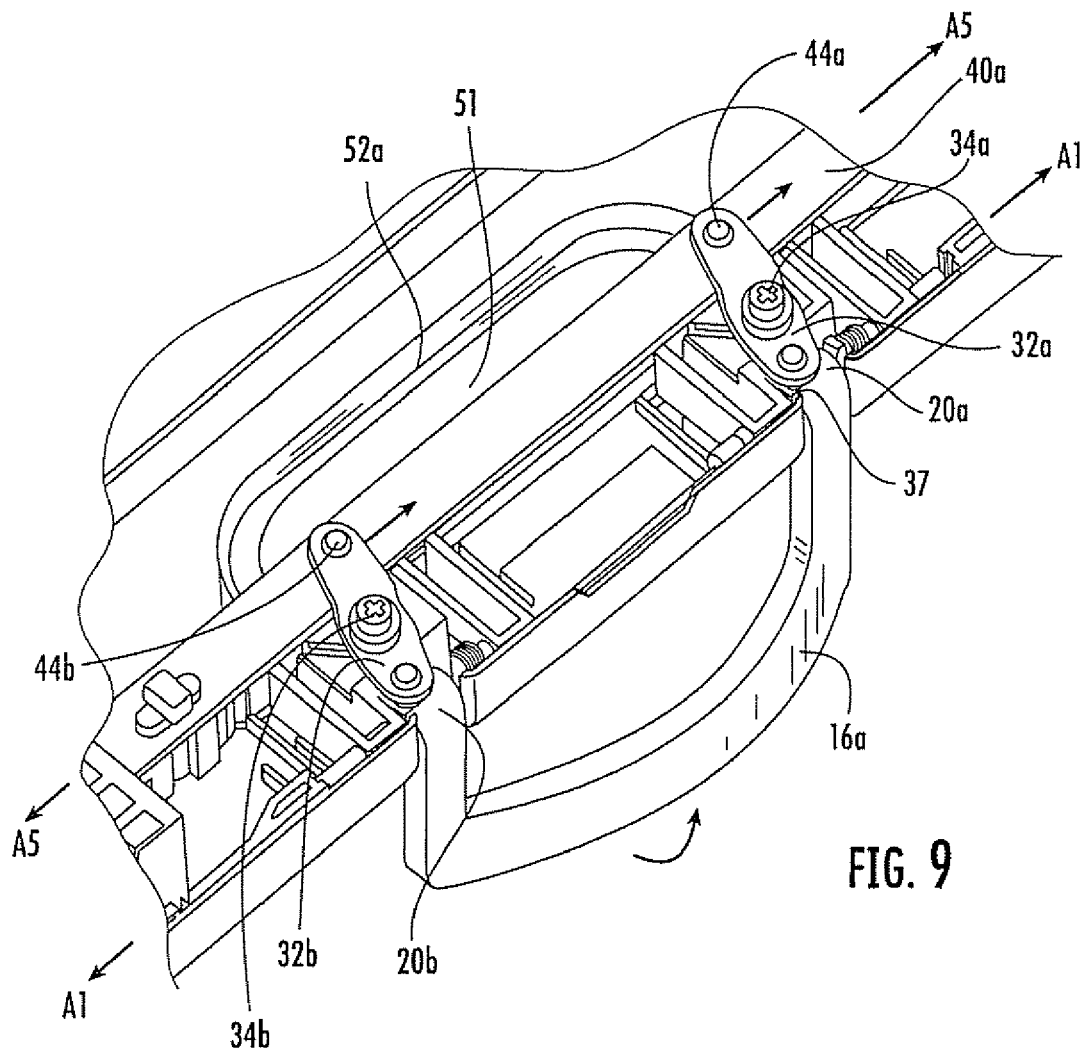
FIG. 9 is an enlarged rear perspective view of the door assembly of FIG. 7 with the handle in an extended position.
Figure 10:
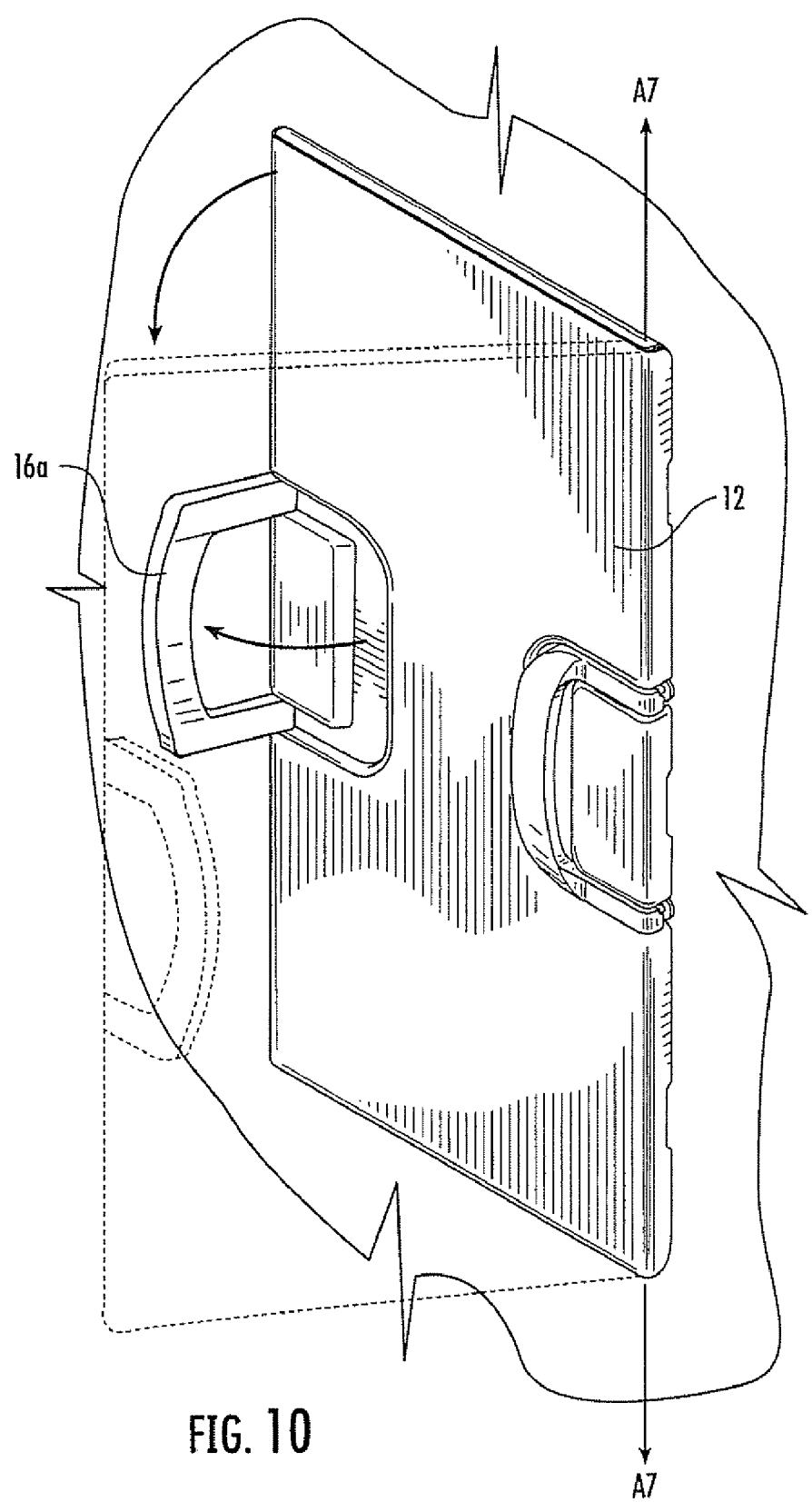
FIG. 10 is an enlarged front perspective view of the door assembly of FIG. 7 showing that extension of the left side handle allows the door to pivot about an axis extending through its right side.
Figure 11:
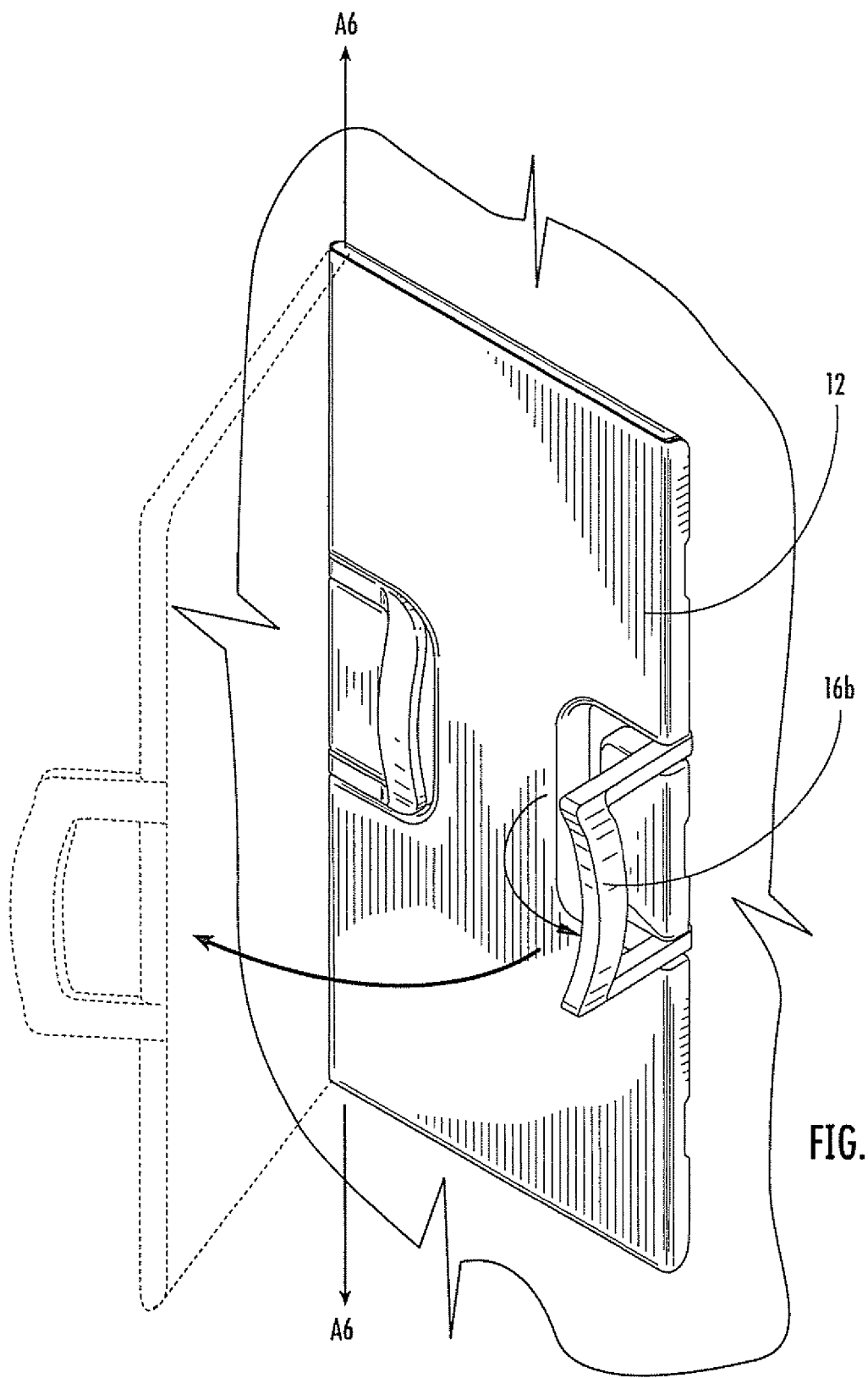
FIG. 11 is an enlarged front perspective view of the door assembly of FIG. 7 showing that extension of the right side handle allows the door assembly to pivot about an axis extending through its left side.

Referring now to FIG. 6, in accordance with some embodiments of the present invention, the door assembly 10 may be mounted via the pins 46, 48 on two communications racks 100, 102 in order to cover a cable trough 104 between the racks 100, 102. The cable trough 104 may be any channel or partially enclosed area that houses communications cables/cords. For example, in the embodiment of FIG. 6, the sides of the racks 100, 102 define a cable trough 104 therebetween. The presence of the latch pins 46, 48 prevents the door assembly 10 from opening inadvertently. In this position (the "closed position") as shown in FIG. 7, the door assembly 10 is latched closed on both the left and right sides and serves as a fixed front wall for a portion of the trough 104. The door assembly 10 thus serves to hide, protect and/or contain cords in the trough 104. More particularly, the latch pins 46, 48 of the latch bar 40a are disposed in a latched position wherein they engage respective mating latch receiving assemblies that are mounted on the rack 100 and the latch pins 46, 48 of the latch bar 40b are disposed in a latched position wherein they engage respective latch receiving assemblies that are mounted on the rack 102. Latch receiving assemblies 450 according to embodiments of the present invention that may be used to receive the latch pins 46, 48 are described below with respect to FIGS. 13-16.

When the door assembly 10 is closed as in FIG. 6, the handles 16a, 16b are in a retracted position in which the arms 18 of each handle 16a, 16b reside in their respective recesses 17 and are generally parallel with the door body 12. With the handles 16a, 16b retracted, the pivot bases 20a, 20b of the handles 16a, 16b are oriented such that the upper ends of the cammed surfaces 22 face rearwardly and contact the cam interface pins 36 of the toggle arms 32a, 32b (see FIG. 2). The handles 16a, 16b are urged toward this retracted position by the springs 30 acting on the handle pins 24a, 24c.

Referring to FIGS. 2 and 3, when the cam interface pins 36 contact the upper ends of the cammed surfaces 22, the toggle arms 32a, 32b are generally horizontally disposed in a lowered position ("the latched position"). In their respective latched positions, the pins 46, 48 of each latch bar 40a, 40b are inserted through and protrude downwardly from their respective compartments 46a, 48a into their mating latch receiving assemblies on the racks 100, 102. As noted above, the latch bars 40a, 40b are urged downwardly by the spring acting on the ribs 49 and the bottom flange 47.

An operator can open the door assembly 10 from either the left side or the right side to access the trough 104 without removing the door assembly 10 from the racks 100, 102. To open the door assembly 10 from either side, a user simply grasps the appropriate handle 16a, 16b and rotates it so that the grasping portion 19 moves away from the center of door body 12 toward a side edge of door body 12. The handle 16a and the linkage between the handle 16a and the pins 46, 48 serve as an actuator to transition the pins 46, 48 from their latched positions to their unlatched positions. More particularly, as is apparent from FIGS. 2-3 and 7-9, rotation of the handle 16a causes the pivot bases 20a, 20b and handle pins 24a, 24b, 24c, 24d to rotate about the axis A1. As the pivot bases 20a, 20b rotate, the cammed surface 22 of each rotates also, such that eventually the lower end of each cammed surface 22 faces rearwardly and is in contact with the cam interface pin 36 (rotation of the handle 16a ceases when a stepped surface 37 on the pivot base 20a contacts the cam interface pin 36). This interaction drives the cam interface pin 36 upwardly, which in turn causes the toggle arms 32a, 32b to rotate about the pivots 34a, 34b (clockwise from the vantage point of FIGS. 8 and 9). The rotation of the toggle arms 32a, 32b drives the inboard ends of the toggle arms 32a, 32b upwardly along the axis A5, which consequently drives the latch bar 40a upwardly. This action slides or lifts the pins 46, 48 out of the latch receiving assemblies in the rack 100 and into their respective unlatched positions, thereby freeing the left side of the door assembly 10 (from the vantage point of FIG. 10) from the rack 100. Moreover, as the pins 46, 48 of the latch bar 40b are still pivotally engaged with their respective latch receiving assemblies of the rack 102, the door assembly 10 can be pivoted about the axis A7 (i.e., the axis of the pins 46, 48 of the latch bar 40b) on the right side of the door assembly 10 to an open position (see FIG. 10). In this manner, the pins 46, 48 of the latch bar 40b and the latch receiving assemblies of the rack 102 in which the pins 46, 48 are received serve as a hinge assembly, and the door assembly 10 can be opened as a right side hinged door.

Alternatively, with the handle 16a released (closed) and the pins 46, 48 of the latch bar 40a inserted in the latch receiving assemblies of the rack 100, the right side handle 16b can be grasped and rotated to lift the latch bar 40b via the toggle arms 32a, 32b. This action slides the pins 46, 48 of the latch bar 40b into their unlatched positions, and the door assembly 10 is thereby freed to rotate about the axis A6 and move to an open position (see FIG. 11). In this manner, the door assembly 10 can be opened as a left side hinged door. Thus the pins 46, 48 can serve as both latches and hinges for the door assembly 10 on either side.

Figure 12:
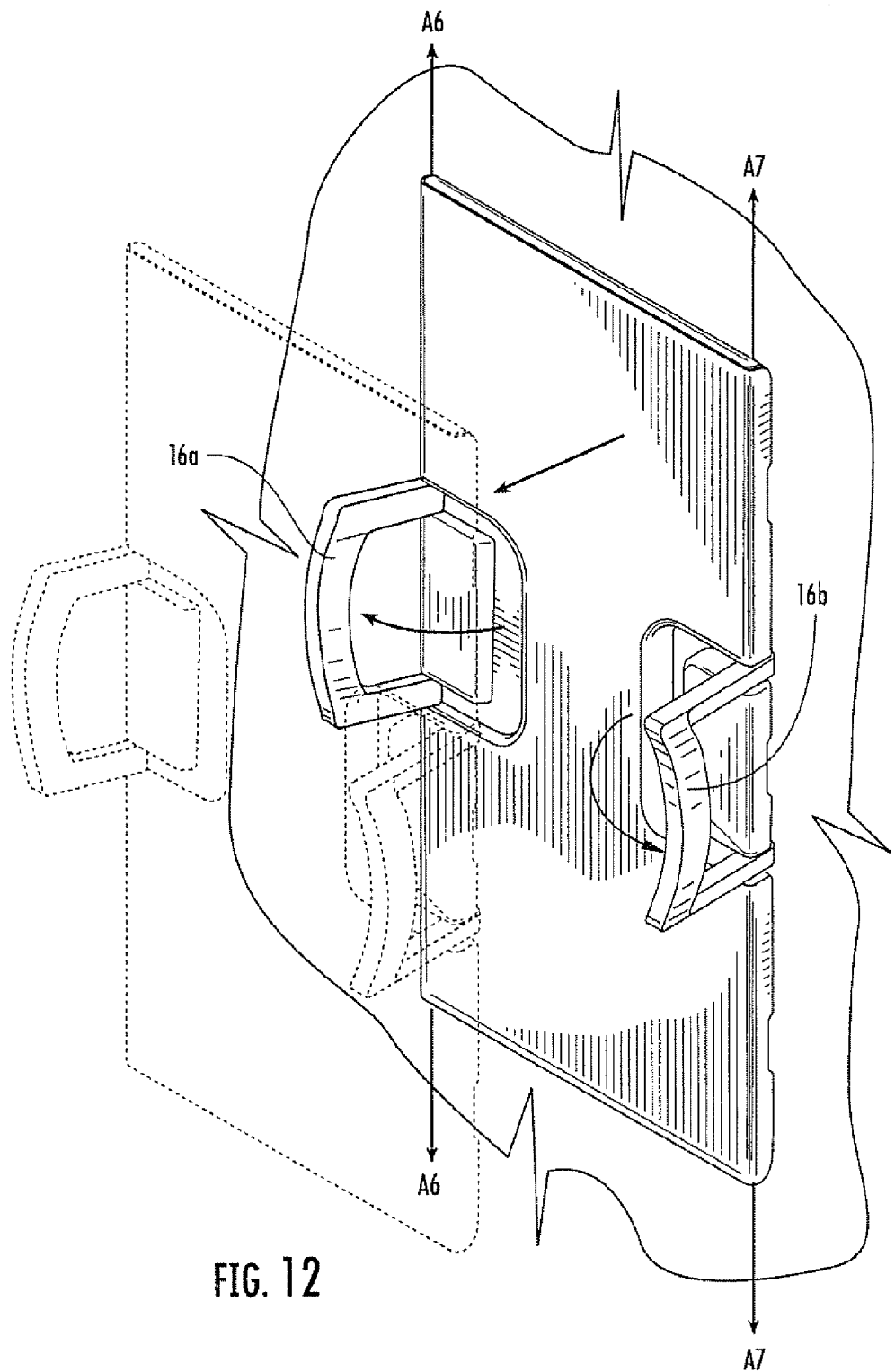
FIG. 12 is an enlarged front perspective view of the door assembly of FIG. 7 showing that extension of both handles allows the door assembly to be removed from its mounted position.

As shown in FIG. 12, an operator can also completely remove the door assembly 10 by simultaneously moving both handles 16a, 16b to their respective extended positions. Extension of both handles 16a, 16b draws the pins 46, 48 on both sides of the door assembly 10 from their respective latch receiving assemblies 450 (i.e., into their unlatched positions). The completely removed door assembly 10 can be returned to its closed position (FIG. 6) by pushing the door body 12 back into place so that the latch pins 46, 48 are received by their respective latch receiving assemblies on racks 100, 102.

Figure 13:
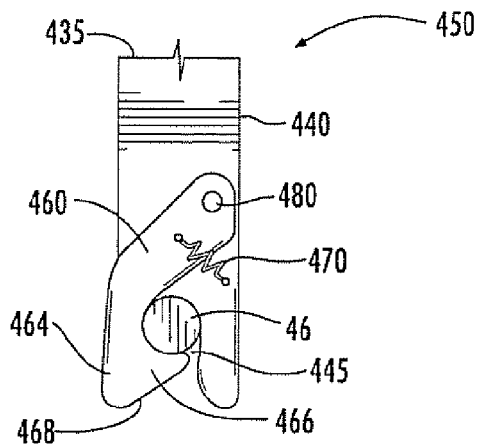
FIG. 13 is a top view of a latch receiving assembly according to embodiments of the present invention with a latch pin of the door assembly of FIG. 1 captured therein.
Figure 14:
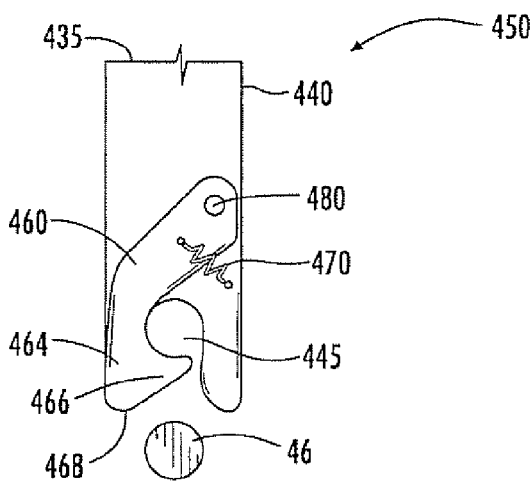
FIG. 14 is a top view of a latch receiving assembly of FIG. 13 with the latch pin of the door assembly of FIG. 1 outside of the latch receiving assembly.
Figure 15:
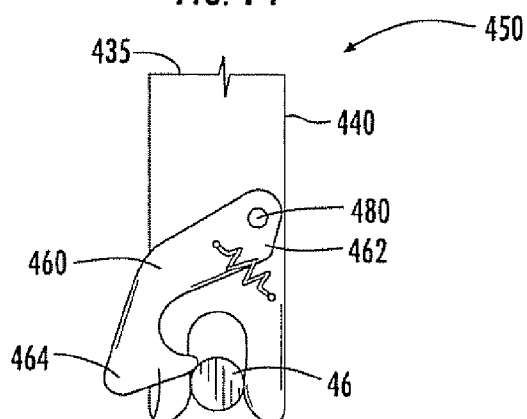
FIG. 15 is a top view of a latch receiving assembly of FIG. 13 with the latch pin of the door assembly of FIG. 1 in the process of being received within the latch receiving assembly.

As noted above, the racks 100, 102 may each include a pair of latch receiving assemblies that receive respective ones of the pins 46, 48 of the door assembly 10. FIGS. 13-15 illustrate latch receiving assemblies 450 according to certain embodiments of the present invention that may be used to mount the door assembly 10 to, for example, the racks 100, 102 or to another support structure 435 such as, for example, a communications cabinet or wall-mounted system. Typically, four of the latch receiving assemblies 450 would be provided on the support structure to mount the door assembly 10 onto the support structure. It will also be appreciated that the latch receiving assemblies 450 may be mounted on the support structure 435 or that, alternatively, at least part of the latch receiving assembly 450 may be formed integrally with the support structure 435.

As illustrated in FIGS. 13-15, the latch receiving assembly 450 may comprise a latch member 460. The latch member 460 includes a rear portion 462 and a forward portion 464. The rear portion 462 is mounted to a support member 440 of support structure 435 via a rivet, pin, or other fastener 480 that may act as a pivot. The forward portion 464 includes a hook 466. The support member 440 includes a slot 445 at one end thereof that is configured to receive a respective one of the latch pins 46 of door assembly 10. The latch member 460 is pivotally mounted to the support member 440 so as to be pivotable between a closed position in which the hook 466 of latch member 460 captures the latch pin 46 within the slot 445 and an open position in which the hook 466 of latch member 460 pivots away from the slot 445 opening. The latch member 460 may be formed from a unitary piece of material such as, for example, a stamped metal plate.

The latch receiving assembly 450 further comprises a spring 470. In the illustrated embodiment, the spring 470 is connected between the support member 440 and the latch member 460, and is configured to bias the forward portion 464 of the latch member 460 toward the closed position in which the hook 466 of latch member 460 captures the latch pin 46 within the slot 445. The spring 470 may merely operate as a return system that returns the latch member to its closed position, and need not be configured to help hold the latch member 460 in its closed position. Accordingly, in some embodiments, a light spring can be used that has a low resistance level.

As can be seen, for example, in FIG. 13, when the latch member 460 is in the closed position, the front edge 468 of hook 466 is angled with respect to the longitudinal axis of slot 445. As will be discussed in further detail below, the latch pin 46 may engage the angled front edge 468 of hook 466 when door assembly 10 is moved to its closed position.

Figure 16:
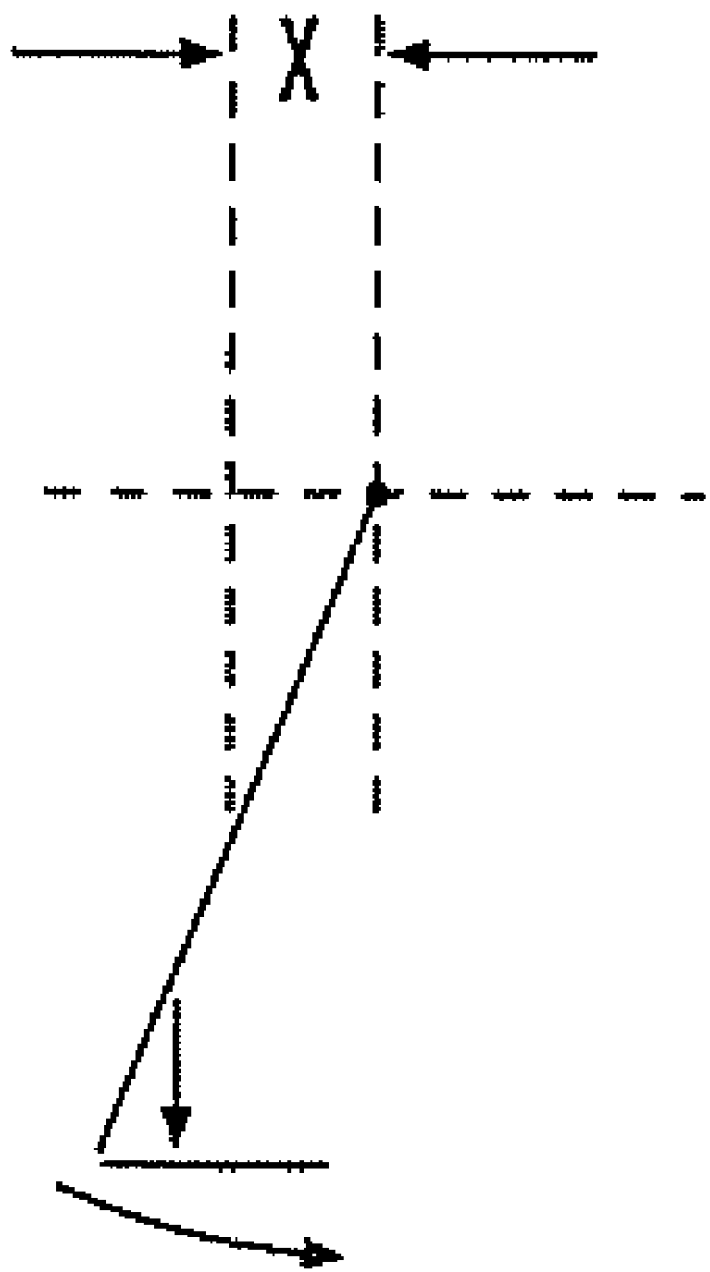
FIG. 16 is a schematic force diagram illustrating how the positive offset of the latch member of the latch receiving assembly of FIG. 14 encourages the latch member to remain closed under load.

Operation of the latch receiving assembly 450 will now be explained with reference to FIGS. 13-15. FIG. 13 illustrates the latch member 460 in its closed position with the latch pin 46 captured within the slot 445 of support member 440. As shown in FIG. 13, the forward portion 464 of the latch member 460 is positioned so that the hook 466 extends across the opening of the slot 445 in support member 440, thereby capturing the latch pin 46 within the slot 445. In this position, the combination of the pin 46 and the latch receiving assembly 450 can operate as either a latch or as a hinge. As is shown in FIG. 16, the positive offset between the hook 466 and the pivot 480 urges the latch member 460 to remain in the closed position under a load from the latch pin 46.

As discussed above with respect to FIGS. 7-9, rotation of one of the handles 16a, 16b (e.g., handle 16b) on the door assembly 10 causes latch pins 46, 48 to move from their latch positions to their unlatched positions (i.e., each of the latch pins 46, 48 are moved upwardly so as to no longer be captured by the hook 466 within the slot 445). Each latch member 460 remains in its closed position of FIG. 13 as the handle 16b is rotated and the latch pins 46, 48 are retracted. Once the latch pins 46, 48 at one edge of the door body 12 are retracted, that edge of the door body 12 is disengaged from the latch member 460, thereby enabling the door body 12 to be opened. The coupling structure between the handles 16a, 16b and the latch pins 46, 48 is configured so that the latch pins 46, 48 are biased toward their latched positions. Thus, when the handles 16a, 16b are not rotated, the latch pins 46, 48 are in their latched positions where they engage their corresponding latch members 460.

FIG. 14 illustrates the latch member 460 in its closed position, except in FIG. 14, the latch pin 46 is outside of the slot 445 of support member 440, as would be the case when the door body 12 is open. When the door body 12 is to be closed, the latch pins 46, 48 are likely to be in their latched (lowered) positions (because typically an operator will not be holding the handle 16b open when closing the door body 12). As shown in FIG. 14, as each latch pin 46, 48 approaches the hook 466 of its respective latch member 460, the latch member 460 is in its closed position. As shown in FIG. 15, as the door 10 is closed, the latch pin 46 engages the angled front edge 468 of hook 466. As it does so, the latch pin 46 forces the forward portion 464 of latch member 460 to pivot away from the slot 445, thereby providing access to the slot 445 for the respective latch pin 46, 48. The latch pin 46, 48 can then slide into the slot 445 (FIG. 15). Once the latch pin 46, 48 has cleared the end of the hook 466, the hook 466, biased by the spring 470, returns to the closed position of FIG. 13, where the latch pin 46 and the latch receiving assembly 450 can operate as either a latch or as a hinge. It can thus be seen that, in this configuration, the latch member 460 allows the door body 12 to be closed without any manipulation of the handle 16b required.

The door assembly 10 includes two upper latch pins 46 and two lower latch pins 48, with a latch pin 46 and a latch pin 48 provided on both the left and right side of door body 12. Accordingly, a pair of mating latch receiving assemblies 450 are provided on both the left and right sides of the support structure 435 (e.g., two latch receiving assemblies 450 would be provided on rack 100, and another two latch receiving assemblies 450 would be provided on rack 102). The latch receiving assemblies 450 may act as either a latch or a hinge. In particular, when the door assembly 10 is operated so that the right side of the door opens, the latch pins 46, 48 and their mating latch receiving assemblies 450 on the left side of the door assembly 10 act as hinges, allowing the door to swing open. In this configuration, the latch pins 46, 48 and mating latch receiving assemblies 450 on the right side of the door assembly 10 act as a latch mechanism. By pulling on the handle 16b, an operator can activate the latch mechanism to disengage the latch (i.e., pins 46, 48), thereby freeing the right side of door assembly 10 so that the door can swing open. When the operator closes the door, the latch pins 46, 48 displace their respective latch members 460 so that the latch pins 46, 48 can be received fully within their respective slots 445, at which point the latch members 460 spring back into their closed positions so as to hold the latch pins 46, 48 within their slots 445.

Those skilled in this art will appreciate that the door assembly 10 and components thereof may take different forms from those illustrated and described herein. For example, the door body 12 need not be planar. It may include a window. The handles 16a, 16b may be configured differently, and/or may be configured to open "out-to-in" rather than "in-to-out", or to not be mirror images. The cammed surfaces 22 of the pivot bases 20a, 20b may be configured similar to a lead screw or a worm gear. The grasping portions 19 may be straight or arcuate in only one direction. The latching components may also take different forms. For example, in some embodiments the toggle arms 32a, 32b may have a different length or shape, or may be omitted entirely, such that the latch bar interacts directly with the cammed surface 22. The latch bars 40a, 40b may be of different lengths and may take a different form. The latch bars 40a, 40b may rely on gravity rather than springs to remain in place, and may be identical rather than mirror images of each other.

Figure 18:
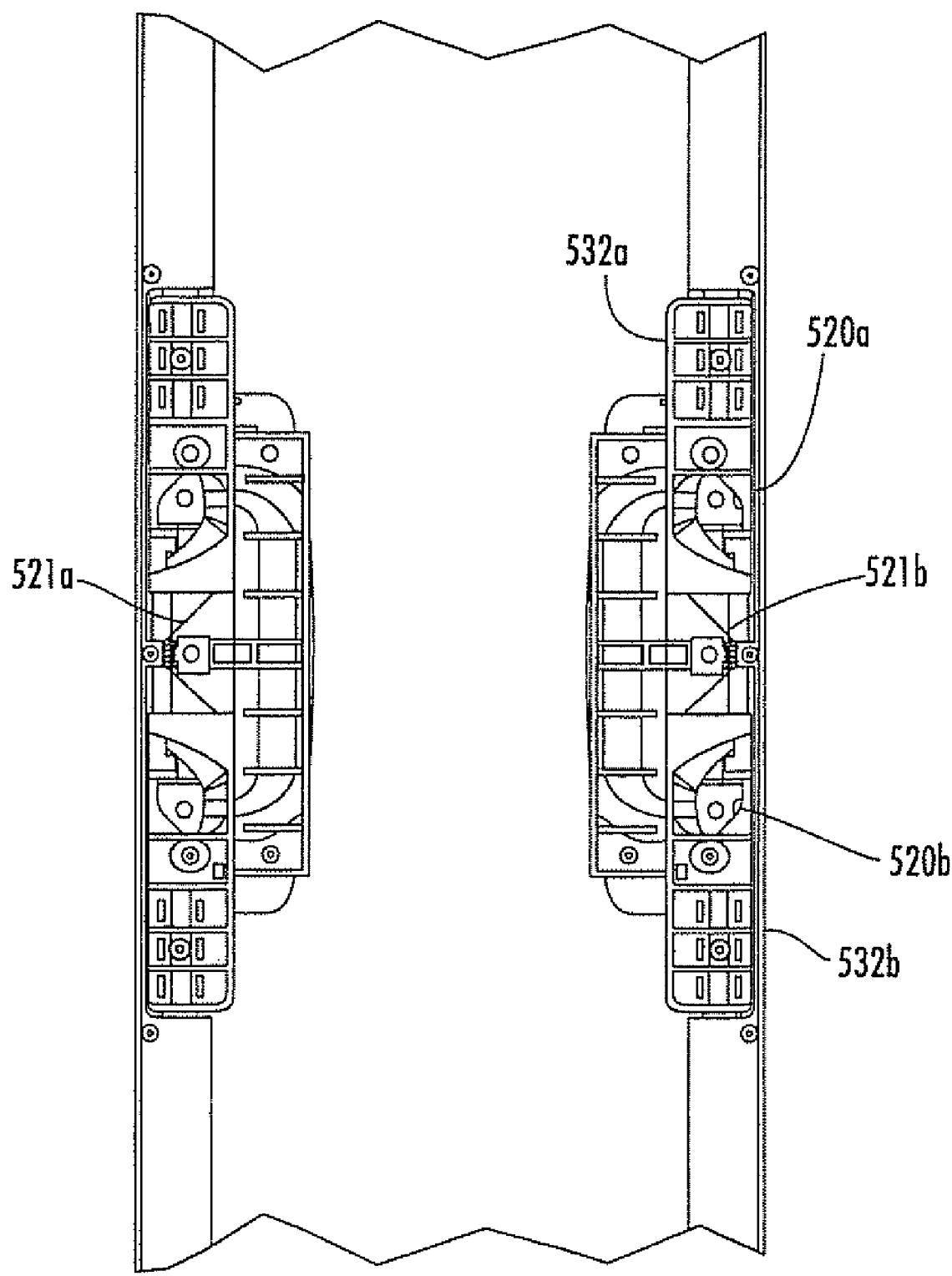
FIG. 18 is a rear view of the center portion of the door assembly of FIG. 17.
Figure 19:
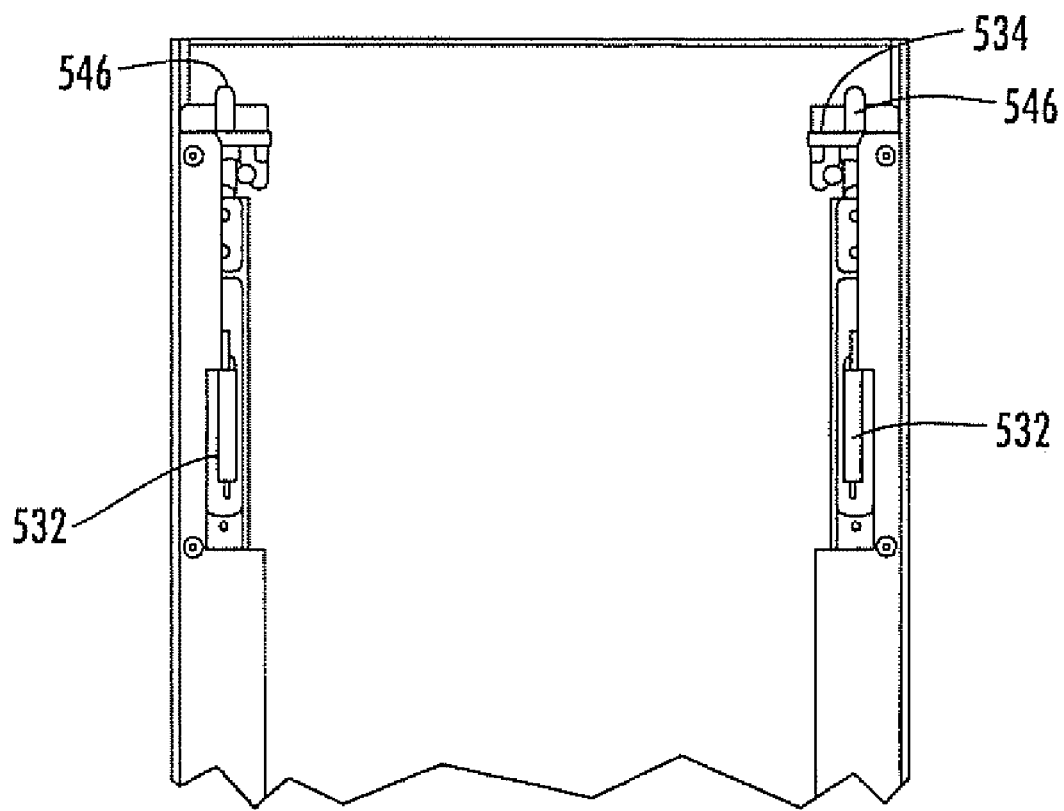
FIG. 19 is a rear view of the top portion of the door assembly of FIG. 17.
Figure 20:
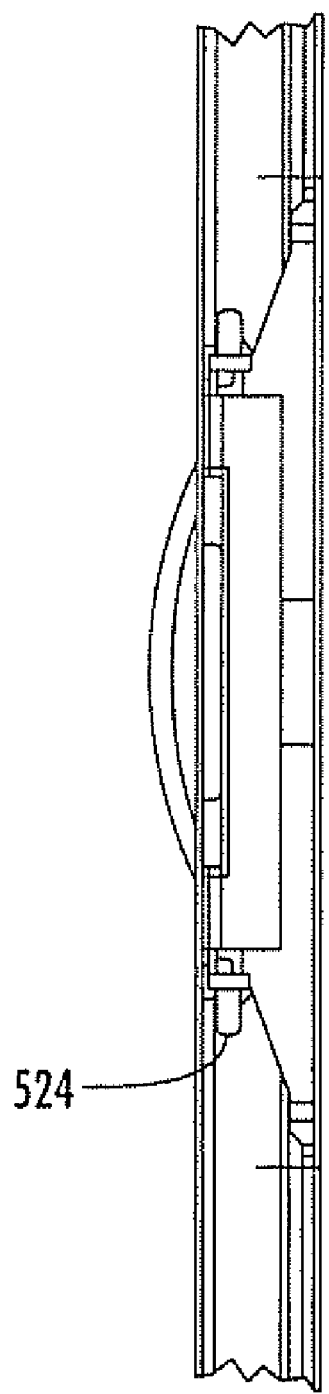
FIG. 20 is a side view of the center portion of the door assembly of FIG. 17.

FIGS. 17-20 illustrate a door assembly 500 for a communications rack, cabinet or wall-mounted system according to further embodiments of the present invention. As shown in FIG. 20, the door assembly 500 may include a substantially planar door body 502 that has side lips or edges 504. The door assembly 500 further includes a center back panel 505, top and bottom back panels 506, 507, and two pairs of latch bars 540a, 540b, 541a, 541b. The door assembly 500 further includes handle/latch mechanisms 508, 509. Center back panel 505 covers and protects handle mechanisms 508, 509, while the top and bottom back panels 506, 507 act to hold the latch bars 540a, 540b, 541a, 541b in their proper positions. Center back panel 505 and top and bottom back panels 506, 507 may be mounted onto and/or adjacent the rear surface of the door body 502 via rivets, adhesive, threaded fasteners or the like.

A handle 516a, 516b is associated with each respective handle mechanism 508, 509. The handles 516a, 516b each fit within a respective recess 517 in the door body 502. The handles 516a, 516b may be generally U-shaped, having two arms 518 that are bridged by a grasping portion 519. The handles 516a, 516b may be mirror images of each other, and hence only handle 516a is described below.

Figure 17:
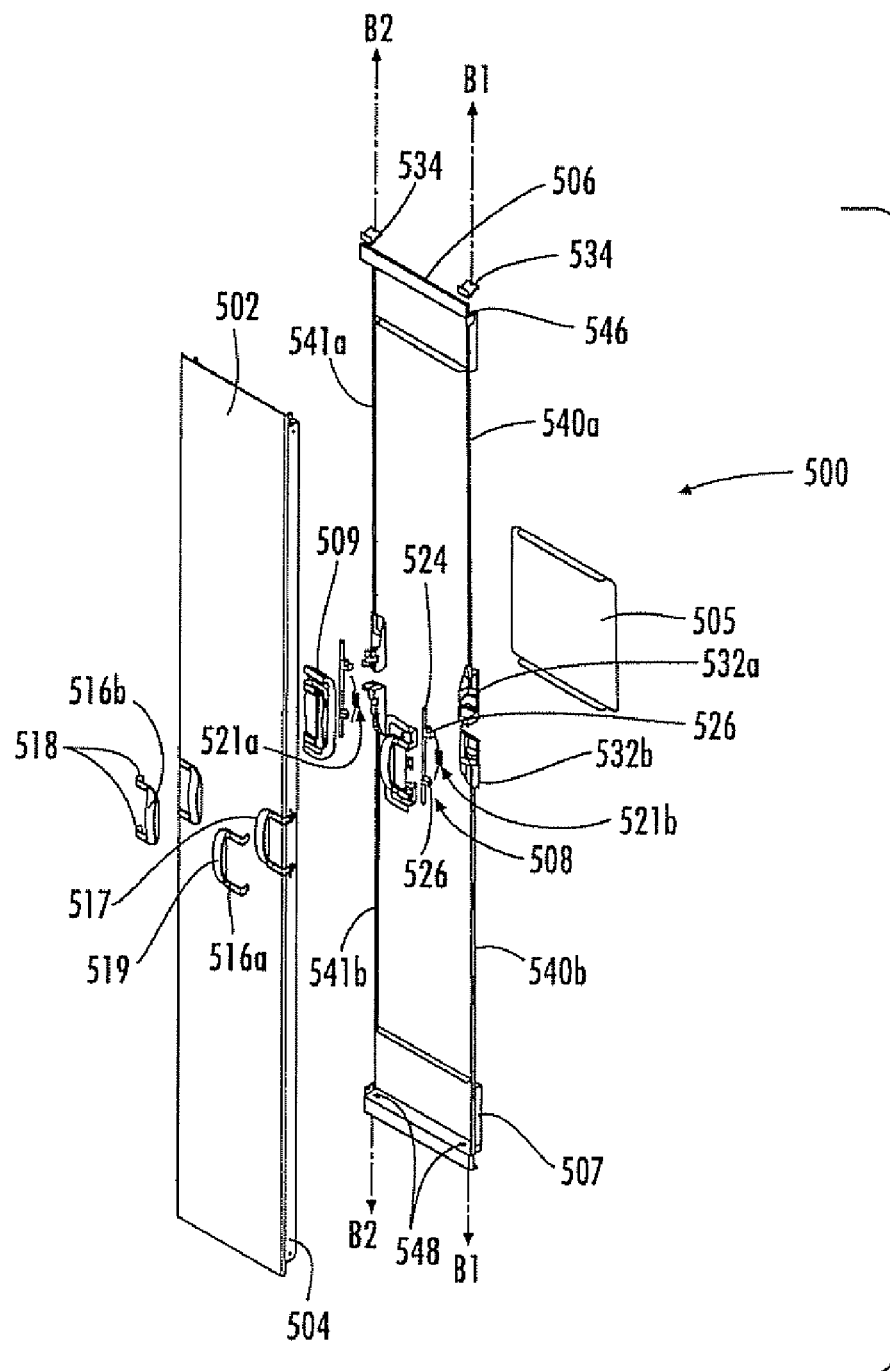
FIG. 17 is an exploded front perspective view of a door assembly for a communications rack, cabinet or wall-mounted system according to further embodiments of the present invention.

Referring to FIGS. 17-19, handle 516a includes a pivot base 520a, 520b at the end of each respective arm 518. Pivot base 520a includes a cammed surface (not visible in FIGS. 17-18) that forms a helical ramp that faces downwardly, while pivot base 520b includes a cammed surface (not visible in FIGS. 17-18) that forms a helical ramp that faces upwardly. A handle pin 524 (see FIG. 20) extends vertically through the pivot bases 520a, 520b. The pivot bases 520a, 520b may be formed integrally with the remainder of the handle 516a. First and second hinges 526 are mounted to the back of door body 502 and or to the side lip 504. Each hinge 526 receives an end of the handle pin 524 of handle 516a. Stops (not shown in FIG. 17) may also be provided that are positioned to rest against each end of the handle pin 524 to maintain the handle 516a in place. A spring 530 (see FIG. 20) is mounted between each end of the handle pin 524 and the door body 502 or other structure to bias the handle 516a toward a closed position, in which the handle 516a resides in the recess 517 of the door body 502.

Still referring to FIGS. 17 and 18, a pair of cams 532a, 532b are mounted to the back of door body 502 and/or to the side lip 504. A first end of cam 532a extends toward and contacts the cammed surface of the adjacent pivot base 520a of handle 516a. A first end of cam 532b similarly extends toward and contacts the cammed surface of the adjacent pivot base 520b of handle 516b.

Referring now to FIGS. 17 and 19, two pairs of generally vertically-disposed latch bars 540a, 540b, 541a, 541b are provided (only the pair of latch bars 540a, 540b will be described herein). The first end of latch bar 540a is mounted to a second end of cam 532a, while the second end of latch bar 540a is received within a corner bushing 534 that is attached to the top back plate 506. Similarly, the first end of latch bar 540b is mounted to a second end of cam 532b, while the second end of latch bar 540b is received within a corner bushing 534 that is attached to the bottom back plate 507.

As shown in FIGS. 17 and 19, the second end of latch bar 540a comprises a latch structure in the form of an upwardly extending latch pin 546 (note that latch pin 546 may simply comprise the end portion of a rod that forms the latch bar 540a). The pin 546 is received in an aperture in corner bushing 534. Similarly, the second end of latch bar 540b comprises a latch structure in the form of a downwardly extending latch pin 548 (note that latch pin 548 may simply comprise the end portion of a rod that forms the latch bar 540b). The pin 548 is received in an aperture in corner bushing 534. The latch bars 540a, 540b are configured to move a short distance along the vertical axis B1 that is defined by the latch bars 540a, 540b to transition between respective latched and unlatched positions. Each latch bar 540a, 540b is in its latched position when its respective latch pin 546, 548 is extended away from the center of door body 502. The latch bars 540a, 540b are in their unlatched positions when their respective latch pins 546, 548 have been moved a short distance along the axis B1 toward the center of door body 502.

Each handle 516a, 516b includes a torsion spring 521a, 521b (see FIG. 17). Torsion spring 521a applies a return force to pivot bases 520a, 520b that acts to hold the latch bars 540a, 540b in their latched (extended) positions. When the handle 516a is rotated, cams 532a, 532b are driven toward the center via the action of pivot bases 520a, 520b thereon, which acts to move the latch bars 540a, 540b to their unlatched positions. Rotation of the handle 516a also acts to load the torsion spring 521a. When the handle 516a is released, the torsion spring 521a provides a force that returns the latch bars 540a, 540b to their latched positions. Handle 516b works in the same way as handle 516a, and hence discussion of the operation of handle 516b will be omitted.

The axis B1 defined by the latch bars 540a, 540b comprises a pivot axis on which the door assembly 500 can pivot (the latch bars 541a, 541b define a second pivot axis B2 on the opposite side of the door assembly 500). A spring 532 (see FIG. 19) may be mounted to the top back plate 506. The spring 532 may be in compression to urge the latch bar 540a downwardly. Another spring 532 (not shown) may be mounted to the bottom back plate 507 that is in compressions and urges the latch bar 540b upwardly.

Figure 21:
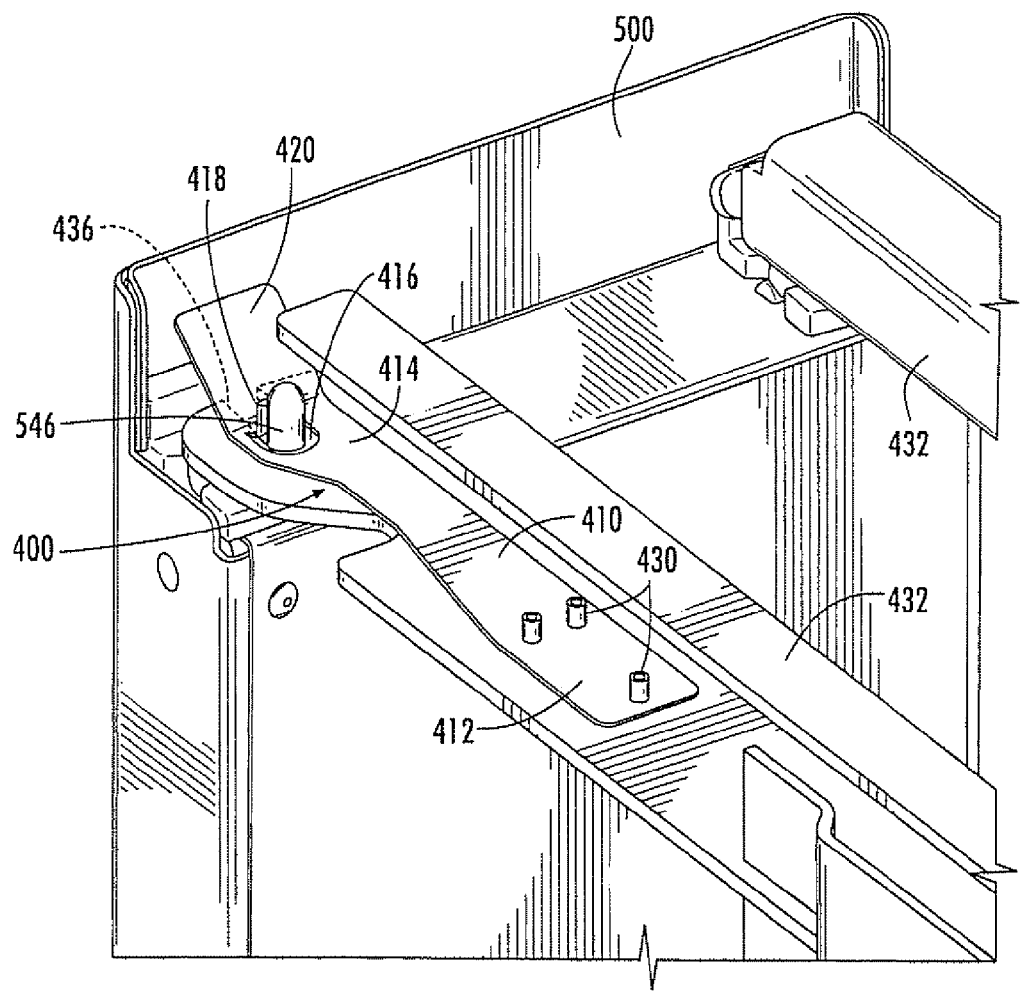
FIG. 21 is a partial perspective view of the door assembly of FIG. 17 mounted on a support structure that includes a latch receiving assembly according to certain embodiments of the present invention.
Figure 22:
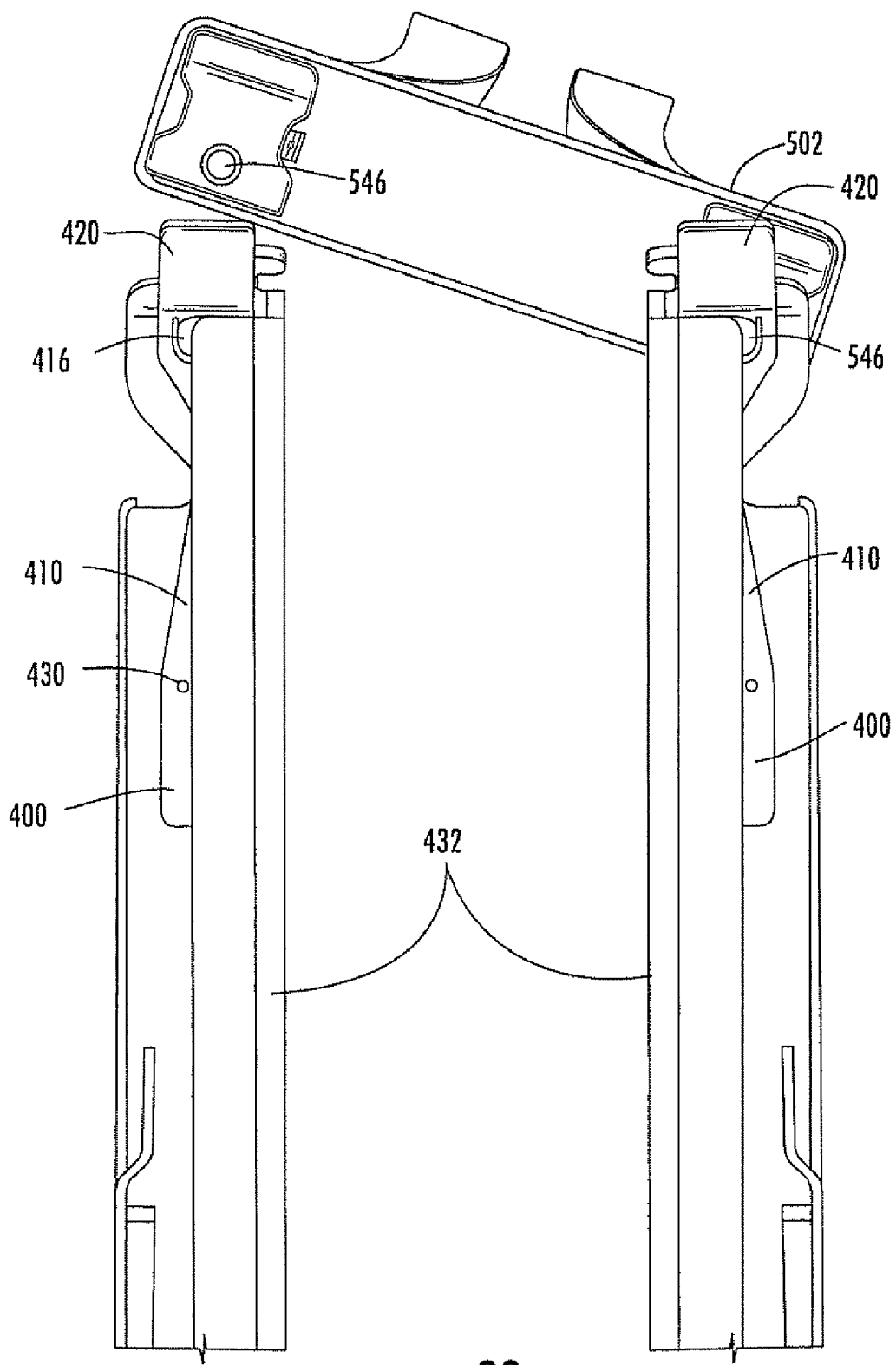
FIG. 22 is a top view of the door assembly and support structure of FIG. 21.
Figure 23:
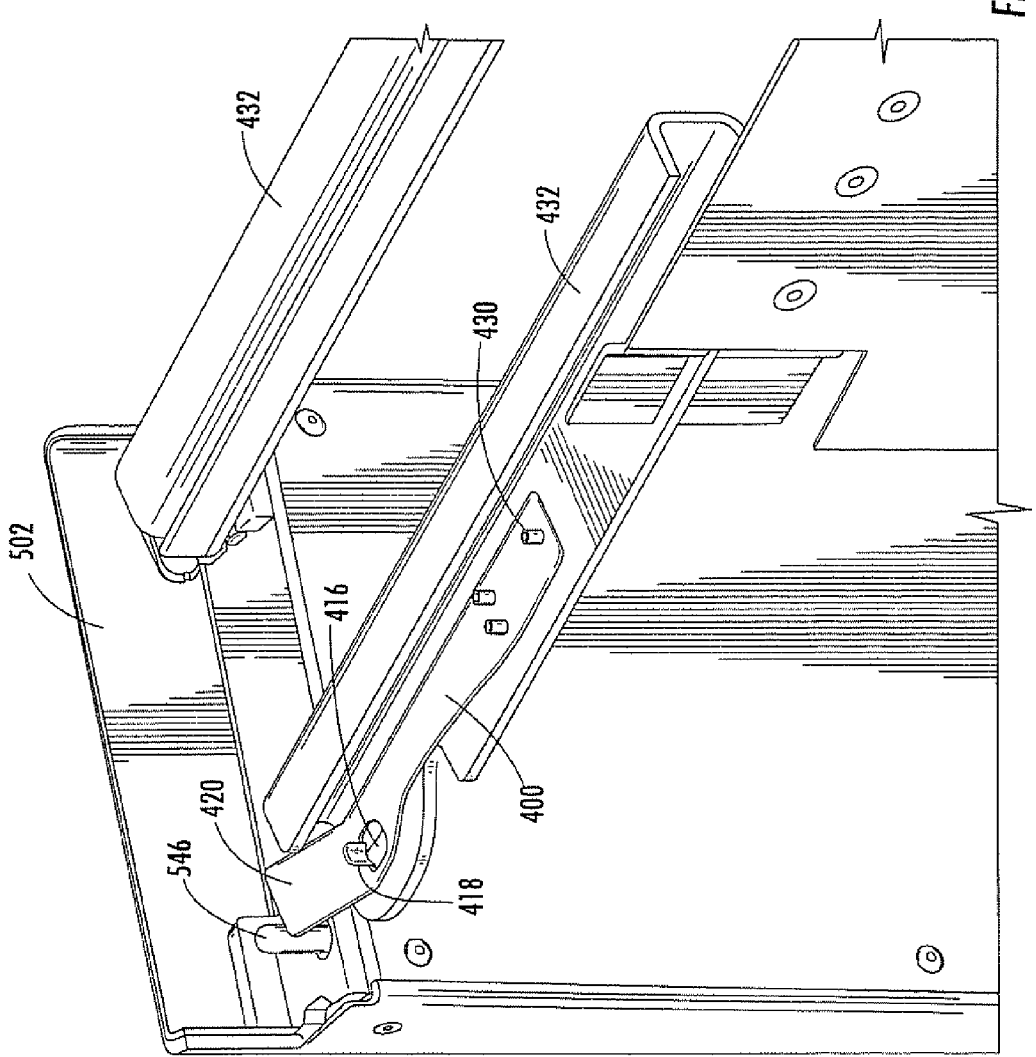
FIG. 23 is a partial perspective view of the door assembly and support structure of FIG. 21 with the door partially opened.

The door assembly 500 may be mounted onto a support structure 432 by mating each of the latch pins 546, 548 with respective latch receiving assemblies that are provided on the support structure 432. FIGS. 21-23 illustrate a support structure 432 for the door assembly 500 that includes latch receiving assemblies 400 according to certain embodiments of the present invention. The support structure 432 may comprise, for example, a communications rack, cabinet or wall-mounted system. While for purposes of simplicity, FIGS. 13-15 each illustrate only one or two such latch receiving assemblies 400, it will be appreciated that typically four latch receiving assemblies 400 would be used to mount the door assembly 500 to the support structure 432, as will be illustrated below with respect to FIGS. 24-25. The latch receiving assemblies 400 may be mounted on, or formed integrally with, the support structure 432.

As can best be seen in FIG. 21, the latch receiving assembly 400 is mounted on the support structure 432. In the embodiment of FIGS. 21-23, the latch receiving assembly 400 comprises a hinge bracket 410 that is mounted to the support structure 432 via several rivets, screws or other fasteners 430. Herein, the term "hinge bracket" refers to a structure that is configured to receive a latch so that the latch and the hinge bracket together can operate as a hinge. The illustrated embodiment of hinge bracket 410 includes a rear portion 412 that is fixedly mounted to the support structure 432 via the fasteners 430 and a forward portion 414 that is elastically mobile. In the pictured embodiment, the hinge bracket 410 may be formed from a unitary piece of material such as, for example, a stamped metal plate. The forward portion 414 includes an aperture 416 that is configured to receive a respective one of the latch pins 546 of door assembly 500. As shown best in FIG. 23, some or all of the material that is removed to form the aperture 416 may be retained and bent upwardly to form a projection 418. As will be explained in further detail below, this projection 418 may provide additional structural support to facilitate keeping latch pin 546 within the hinge bracket 410 when the right side of the door assembly 500 (when door assembly 500 is viewed from the front) is in its closed position.

As can also be seen in FIG. 21, the forward portion 414 of hinge bracket 410 includes a ramped portion 420. The ramped portion 420 may be positioned so as to form an acute angle with respect to the longitudinal axis of latch pin 546. As will be discussed below, the ramped portion 420 acts as a striker plate that is engaged by the latch pin 546 when door assembly 10 is closed. The forward edge of the support stricture 432 includes a slot 436 (partially visible in FIG. 21) that is aligned with and positioned underneath the aperture 416 of hinge bracket 410. As will be explained in further detail below, the slot 436 provides the latch pin 546 of door assembly 500 access to the aperture 416.

Operation of the hinge bracket 410 will now be explained. As discussed above, and shown in FIGS. 21-23, the latch pin 546 of latch bar 540b may be disengaged from the hinge bracket 410 in order to open the right side of door assembly 500. Thereafter, an operator may return the right side of door assembly 500 to its closed position by pushing the right side of door body 502 toward the support structure 432. As shown best in FIG. 23, the latch pin 546 will be in its raised position once the operator releases the handle 516b. As the door assembly 500 closes, the latch pin 546 of latch bar 540b eventually comes into contact with the striker plate 420. When this occurs, the striker plate 420, which is part of the elastically mobile portion of hinge bracket 410, is forced upward by the latch pin 546. The top of the latch pin 546 slides down the striker plate 420 as the striker plate moves upward, until eventually the latch pin 546 slides underneath the striker plate 420 and into the aperture 416. When this occurs, the latch pin 546 ceases to provide an upward force on the hinge bracket 410, and thus the elastically mobile portion of the hinge bracket 410 snaps back into its resting position, thereby capturing the latch pin 546 in the aperture 416 as is illustrated in FIG. 21. The closing operation is the same for each of the left and right sides of the door assembly 500. It will be understood that this description likewise applies to closing of the right side of the door assembly 500.

As should be clear from the above description, the combination of the latch pin 546 and the hinge bracket 410 can act as both a latch and as a hinge. For example, as shown in FIGS. 21-23, a latch pin 546 is provided on both the left and right side of door assembly 500. Similarly, a mating hinge bracket 410 is provided on both the left and right sides of the support structure 432. As shown in FIGS. 22-23, when the door assembly 500 is operated so that the right side of the door opens, the latch pin 546 and mating hinge bracket 410 on the left side of the door assembly act as a hinge, allowing the door to swing open. In this configuration, the latch pin 546 and mating hinge bracket 410 on the light side of the door assembly act as a latch mechanism. By pulling on the handle 516b, an operator can activate the latch mechanism to disengage the latch (i.e., pin 546), thereby freeing the right side of door assembly 500 so that the door can swing open. When the operator closes the door, the latch pin 546 upwardly displaces the hinge bracket 410 until the latch pin 546 is received within the aperture 416, at which point the hinge bracket 410 falls back into place where the latch pin 546 and hinge bracket 410 can operate as either a closed latch or as a hinge.

Each of the latch pins 548 cooperate with its respective latch receiving assembly 400 in the same fashion as is discussed above with respect to the latch pins 546. However, the latch receiving assemblies 400 that cooperate with the latch pins 548 will be mounted upside down as compared to the mounting orientation of the latch receiving assemblies 400 that cooperate with the latch pins 546.

It will also be appreciated that pursuant to further embodiments of the present invention, the hinge bracket 410 may comprise a fixed member, while the latch pin 546 may be spring loaded. In such embodiments, when the pin 546 engages the striker plate 420 as the door assembly 500 is closed, the hinge bracket 410 remains fixed, and the striker plate 420 imparts a downward force on the spring loaded pin 546. This downward force forces the pin down until the latch pin 546 is able to slide past and under the striker plate 420, at which point the latch pin 546 is received within the aperture 416. When this occurs, the compressive force is removed and the latch pin 546 returns to its latched position where it is captured within the aperture 416 where the latch pin 546 can operate as either a closed latch or as a hinge.

Figure 24:
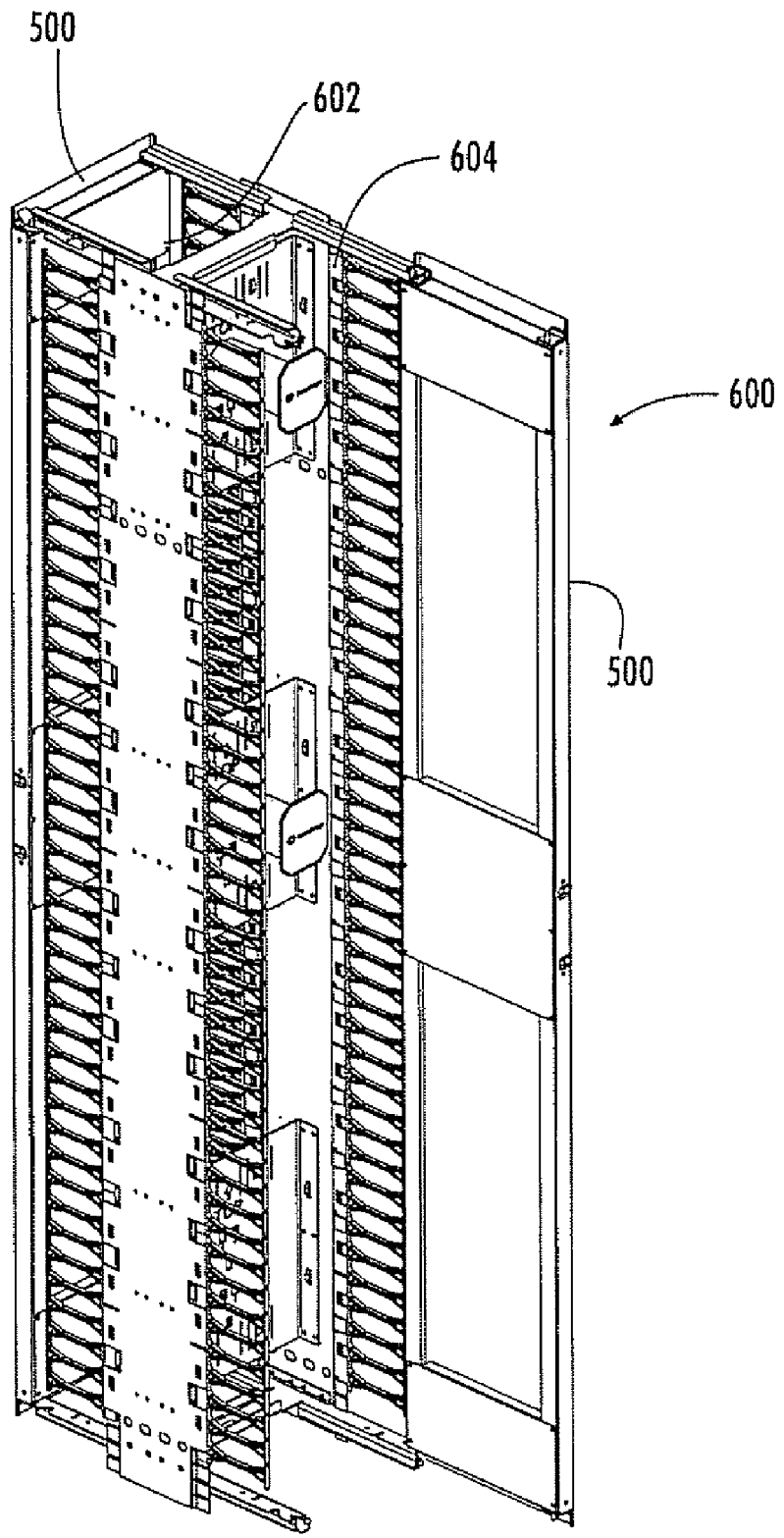
FIG. 24 is a side perspective view of a cable management system that includes two of the door assemblies of FIG. 17.
Figure 25:
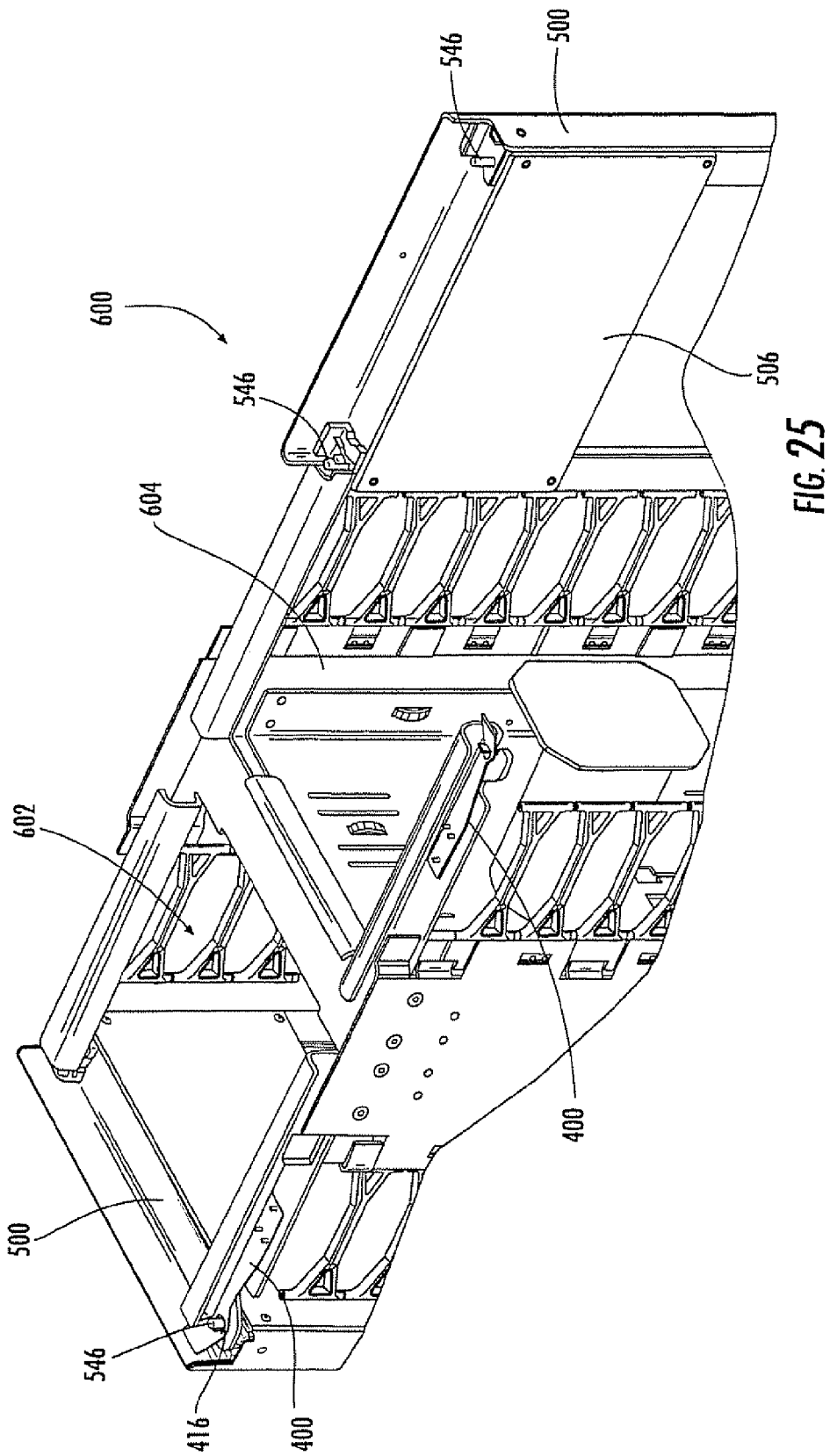
FIG. 25 is an enlarged partial side perspective view of a portion of the cable management system of FIG. 24.

FIGS. 24 and 25 illustrate a cable management system 600 that uses a pair of the door assemblies 500. The cable management system 600 comprises a pair of cable management towers 602, 604. Each cable management tower 602, 604 includes four of the latch receiving assemblies 400 that are discussed above with respect to FIGS. 21-23. Each latch receiving assembly 400 receives a respective one of the four latch pins 546, 548 of one of the door assemblies 500 to mount that door assembly 500 on each respective cable management tower 602, 604.

Referring now to FIG. 25, the door body 502 on the assembly 500 that is mounted on cable management tower 602 is closed. When the door body 502 is in this closed position, the door handles 516a, 516b are in their retracted positions in which the arms 518 of each handle 516a, 516b reside in their respective recesses 517 and are generally parallel with the door body 502. As discussed above, the handles 516a, 516b are urged toward this retracted positions by the springs 530 that act on the handle pins 524. With the handles 516a, 516b retracted, the pivot bases 520a, 520b contact the cams 532a, 532b so as to hold the cams 532a, 532b in their extended positions. As the latch bars 540a, 540b, 541a, 541b are attached to respective of the cams 532a, 532b, each latch bar 540a, 540b, 541a, 541b is likewise held in its extended position when the handles 516a, 516b are in their retracted positions. When the latch bars 540a, 540b, 541a, 541b are in their extended positions, the latch pins 546, 548 of each latch bar are received within the aperture 416 of their respective latch receiving assemblies 400, thereby firmly holding the door assembly 500 closed on the cable management tower 602.

An operator can open the door assembly 500 from either the left side or the right side to access the interior of the cable management tower 602 without removing the door assembly 500 from its cable management tower 602. This is illustrated in FIG. 25 with respect to the door assembly 500 that is mounted to cable management tower 604. To open the door assembly 500 from either side, the operator simply grasps the appropriate handle 516a, 516b and rotates it so that the grasping portion 519 moves away from the center of door body 502 toward a side edge of door body 502. The handle 516a and the linkage between the handle 516a and the pins 546, 548 serve as an actuator to transition the latch pins 546, 548 from their latched positions to their unlatched positions. For example, as shown in FIG. 25, rotation of the handle 516a causes the pivot bases 520a, 520b having cammed surfaces to rotate. As the cammed surfaces on the pivot bases 520a, 520b rotate, they interact with their respective cams 532a, 532b, allowing the respective cams 532a, 532b to move toward the center of the door body 502 under the compressive force provided by springs 532. As the respective cams 532a, 532b move toward the center of the door body 502, the latch bar 540a that is attached to cam 532a and the latch bar 540b that is attached to cam 532b likewise move toward the center of the door body 502 (i.e., toward their unlatched positions). Consequently, the latch pins 546, 548 on the left side of the door assembly 500 are moved out of the apertures 416 of their respective latch receiving assemblies 400 of cable management tower 604 (i.e., into their respective unlatched positions), thereby freeing the left side of the door body 502 (from the vantage point of FIG. 25) from the cable management tower 604.

With the pins 546, 548 of the latch bars 540a, 540b free and the pins 546, 548 of the latch bars 541a, 541b still pivotally engaged with the latch receiving assemblies 400 on the right side of cable management tower 604, the door assembly 500 on cable management tower 604 can be pivoted about the vertical axis defined by the latch bars 541a, 541b on the right side of the door assembly 500 to the open position shown in FIG. 25. In this manner, the pins 546, 548 and the respective latch receiving assemblies 400 in which the pins 546, 548 are received serve as a hinge assembly, and the door assembly 500 can be opened as a right side hinged door. It will likewise be appreciated that, alternatively, the right side handle 516b can be grasped and rotated to open the door assembly as a left side hinged door, or both handles 516a, 516b can be grasped and rotated to completely remove door assembly 500, in a manner similar to the operations discussed above with respect to door assembly 10.

While in FIGS. 24-25, latch receiving assemblies 400 are provided on the support structure 432, it will be appreciated that in other embodiments, the latch receiving assemblies 450 discussed above with respect to FIGS. 13-16 may be used instead on the support structure 432.

Likewise, the support structure 432 could include, for example, two of the latch receiving assemblies 400 and two of the latch receiving assemblies 450. Additionally, other combinations and/or other types of latch receiving assemblies could also be used.

Figure 26:
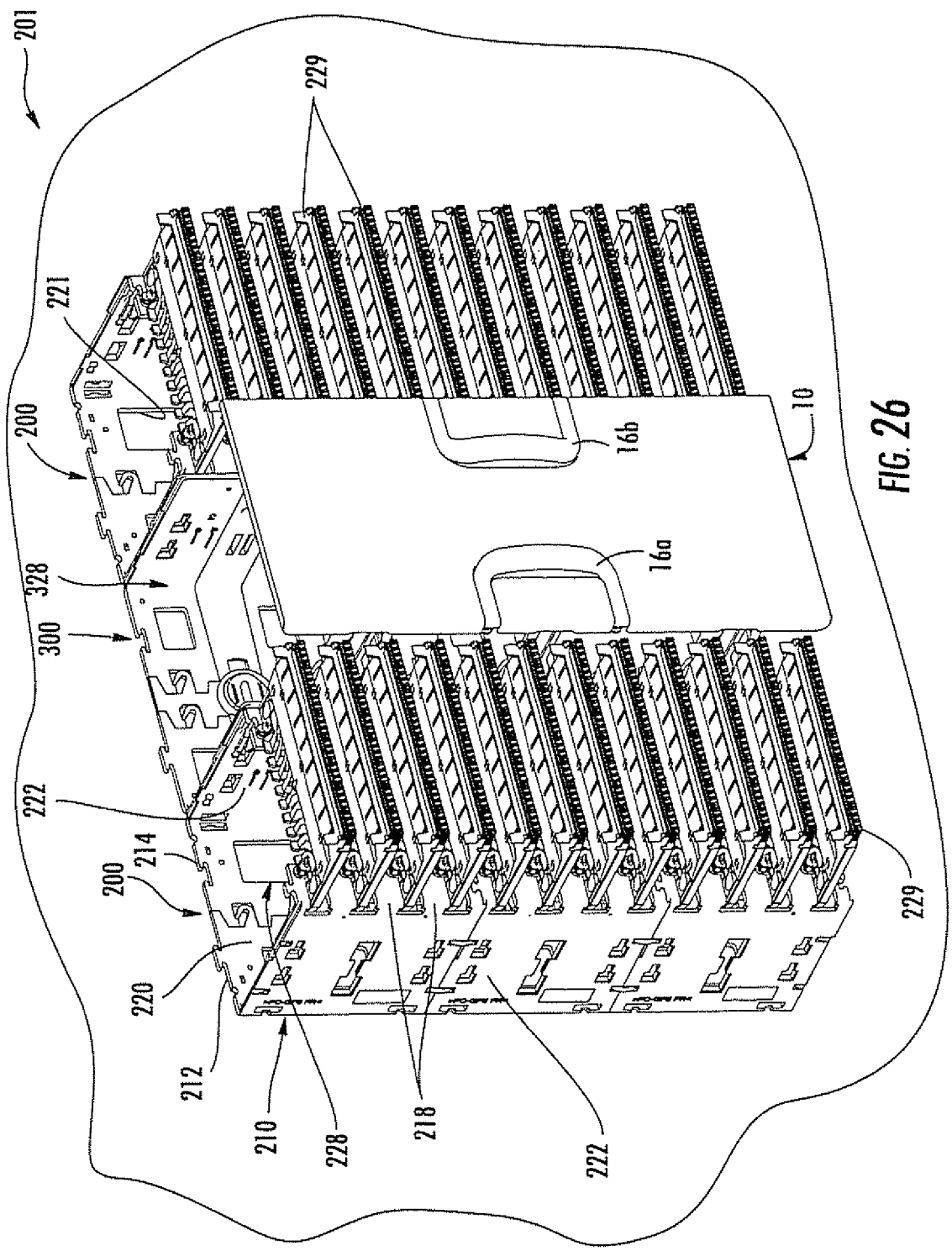
FIG. 26 is a front perspective view of a terminal block panel system according to embodiments of the present invention including the door assembly of FIG. 1.

FIG. 26 illustrates a terminal block panel system 201 in accordance with further embodiments of the present invention. The system 201 includes a spacer bracket assembly 300 and a pair of terminal block panels or patch panel assemblies 200. The panel assemblies 200 may be mounted, for example, on a wall in side-by-side, spaced apart arrangement. The spacer bracket assembly 300 is mounted between the panel assemblies 200. The spacer bracket assembly 300 may be secured to the wall and/or one or both of the back panel assemblies 200. The spacer bracket assembly 300 defines a cable trough 328 through which cords may be routed for connecting connection blocks 229 mounted on the back panel assemblies 100, 200. A door assembly 10 (see FIG. 1) is mounted on the spacer bracket assembly 300 (or, alternatively, on the panel assemblies 200). The door assembly 10 protects and hides cords in the trough 328, and the latch system thereof permits selective access to the trough 328 in the manner described above.

The panel assemblies 200 are exemplary, and thus it will be appreciated that one or both panel assemblies 200 may be configured differently than illustrated and described herein. Each panel assembly 200 may comprise, for example, a 900 pair device, a 300 pair device, a 100 pair device, or any other configuration as is known in the art. In some embodiments, the panel assemblies 200 may be panel assemblies as disclosed in U.S. Pat. No. 6,106,329 to Baker, III et al.

The panel assembly 200 includes a C-shaped back panel 210. The back panel 210 may comprise, for example, a non-conductive material such as a foamed plastic or polymeric material. The back panel 210 may include a rear or securing wall 220, a pair of opposed side walls 222, and a series of mounting structures 218 extending along the front edge of each side wall 222. A plurality of connection blocks 229 may be mounted on the mounting structures 218. In some embodiments, the back panel 210 may comprise a first panel member 212 and a second panel member 214 that are attached together to form the back panel 210.

A cable trough 228 is formed in the area between the side walls 222, the securing wall 220 and the mounting structures 218. The trough 228 may receive a plurality of communication cables (not shown), some of which may simply extend through the trough, while others are connected to devices such as connection blocks 229 that are mounted to mounting structures 218. Cable management structures such as loop members may be secured to the back panel 210 to hold or guide the cables in the trough 228. Each securing wall 220 may have cut-outs or fastener holes 221 or other features for mounting the back panel 210 to hooks or fasteners, such as a screw, nails, clips or the like that are secured to a wall.

The spacer bracket 310 may be C-shaped and formed of the same materials and in the same manner as the back panel 210. The spacer bracket 310 includes a rear wall and opposed, spaced apart side walls that define the cord trough 328. Cable management structures such as retention bars may be secured to the spacer bracket 310 to hold the communications cords in the trough 328. The rear wall may have one or more cut-outs or fastener holes or other features for mounting the spacer bracket 310 on an adjacent back panel 200 or a hook or fastener, such as a screw secured to or mounted on a wall or backboard. Other securing devices such as nails, clips, etc. may be used for securing the spacer bracket 310 to a wall or other structure.

A pair of left side latch receiving assemblies 450 and a pair of right side latch receiving assemblies 450 (not visible in FIG. 26) are provided on the front of the spacer bracket 310. As discussed above, the latch receiving assemblies 450 define pivot holes or slots within which the respective pins 46, 48 of the latch bars 40a, 40b are slidably and pivotably mounted for vertical reciprocation and rotation about a vertical axis.

The door assembly 10 can be mounted on, opened and removed from the spacer bracket 310 in substantially the same manner as described above with regard to the rack system of FIG. 6. More particularly, with each of the latch bars 40a, 40b in the latched position, the upper and lower pins 46, 48 of the latch bar 40a are received in the upper and lower left side latch receiving assemblies 450 and the upper and lower pins 46, 48 of the latch bars 40b are received in the upper and lower right side latch receiving assemblies 450 so that the door assembly 10 is supported by the latch receiving assemblies 450 in the closed position (FIG. 21). The left handle 16a can be rotated to lift and withdraw the pins 46, 48 of the latch bar 40a out of the latch receiving assemblies 450 (i.e., into their unlatched positions), whereupon the operator can pivot the door assembly 10 about the pivot pins 46, 48 of the latch bar 40a to open the door assembly 10 from the left side. Alternatively, the right side handle 16b can be operated to pivot the door assembly 10 about the pivot pins 46, 48 of the latch bar 40b to release the pins 46, 48 from the latch receiving assemblies 450 and thereby permit the operator to open the door assembly from the right side. Alternatively, both handles 16a, 16b can be rotated to release the pins 46, 48 of both latch bars 40a, 40b from the latch receiving assemblies 450 to permit full removal of the door assembly 10 from the spacer bracket 310.

It will be appreciated that door assemblies according to embodiments of the present invention may be operably mounted on various types or configurations of support structures to form communications cable management systems. The support structure may be comprised of a single or integral unit (like the spacer bracket 310) including the mount structures for both sides of the door assembly. Alternatively, the support structure may be two or more physically separated units (e.g., like the racks 100, 102) including the mount structures for respective sides of the door assembly. According to some embodiments, a door assembly according to the present invention, the door assembly may be mounted on a terminal block panel such as the terminal block panel 200 modified to include suitable mount structures such as the latch receiving assemblies 400 or 450.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the invention.

What is claimed is:

1. A communications cable management system comprising:
    a cable trough having an at least partially exposed side;
    a door having first and second opposed side edges that covers at least a portion of the exposed side of the cable trough;
    a first latch that is attached to the door;
    a second latch that is attached to the door; and
    a support structure that includes a first latch receiving assembly that is at least partially moveable and a second latch receiving assembly that is at least partially moveable;
    wherein the first latch receiving assembly comprises a first hinge bracket that includes a first opening that is configured to receive the first latch, wherein the first hinge bracket includes a mounted portion that is fixedly mounted to the support structure and an elastically mobile portion that includes the first opening;
    wherein the second latch receiving assembly comprises a second hinge bracket that includes a second opening that is configured to receive the second latch, wherein the second hinge bracket includes a mounted portion that is fixedly mounted to the support structure and an elastically mobile portion that includes the second opening;
    wherein the first latch is selectively positionable between a latched position in which the first latch is received in the first latch receiving assembly to secure the door to the support structure for pivotal movement about a first pivot axis proximate the first side edge of the door, and an unlatched position in which the first latch is removed from the first latch receiving assembly to permit the first side edge of the door to be separated from the support structure; and
    wherein the second latch is selectively positionable between a latched position in which the second latch is received in the second latch receiving assembly to secure the door to the support structure for pivotal movement about a second pivot axis proximate the second side edge of the door, and an unlatched position in which the second latch is removed from the second latch receiving assembly to permit the second side edge of the door to be separated from the support structure.

2. The communications cable management system of claim 1, wherein the first hinge bracket includes a first striker plate that is positioned between a front surface of the door and the first opening, and the second hinge bracket includes a second striker plate that is positioned between the front surface of the door and the second opening.

3. The communications cable management system of claim 2, wherein the first striker plate is positioned so as to define an acute angle with respect to a longitudinal axis of the first latch.

4. The communications cable management system of claim 3, wherein the first striker plate is part of the elastically mobile portion of the hinge bracket so that the first latch forces the striker plate upwardly until the first latch is received within the first opening when the door is moved from an open position to a fully closed position.

5. The communications cable management system of claim 1, wherein:
    the support structure further includes a third latch receiving assembly and a fourth latch receiving assembly, the system further comprising:
        a third latch that is selectively positionable between a latched position in which the third latch is received in the third latch receiving assembly to secure the door to the support structure for pivotal movement about the first pivot axis, and an unlatched position in which the third latch is removed from the third latch receiving assembly to permit the first side edge of the door to be separated from the support structure;
        a fourth latch that is selectively positionable between a latched position in which the fourth latch is received in the fourth latch receiving assembly to secure the door to the support structure for pivotal movement about the second pivot axis, and an unlatched position in which the fourth latch is removed from the fourth latch receiving assembly to permit the second side edge of the door to be separated from the support structure.

6. The communications cable management system of claim 5, wherein:
    when the first, second, third and fourth latches are in their latched positions, the door is secured in a closed position on the support structure;
    when the first, second, third and fourth latches are in their unlatched positions, the door can be removed from the support structure;
    when the first and third latches are in their latched positions and the second and fourth latches are in their unlatched positions, the door can be pivoted open about the first pivot axis; and
    when the second and fourth latches are in their latched positions and the first and third latches are in their unlatched positions, the door can be pivoted open about the second pivot axis.

7. The communications cable management system of claim 6, further comprising:
    a first actuator operable by a user to selectively move the first and third latches from their latched positions to their unlatched positions; and
    a second actuator operable by a user to selectively move the second and fourth latches from their latched positions to their unlatched positions.

8. The communications cable management system of claim 7, wherein:
    the third latch receiving assembly comprises a third hinge bracket that includes a third opening that is configured to receive the third latch, and the fourth latch receiving assembly comprises a fourth hinge bracket that includes a fourth opening that is configured to receive the fourth latch;
    the first, second, third and fourth latches comprise a first latch pin, a second latch pin, a third latch pin and a fourth latch pin, respectively;
    the first actuator is operable to slide the first latch pin out of the first opening and to slide the third latch pin out of the third opening along a first slide axis that is substantially parallel to the first pivot axis; and
    the second actuator is operable to slide the second latch pin out of the second opening and to slide the fourth latch pin out of the fourth opening along a second slide axis that is substantially parallel to the second pivot axis.

9. The communications cable management system of claim 1, wherein the support structure comprises a spacer bracket assembly that is configured to be mounted between a pair of terminal block panel assemblies.

10. A communications cable management system comprising:
- a cable trough;
- a door that is configured to provide access to the cable trough;
- a first latch structure that is attached to the door, the first latch structure including a first latch and a second latch;
- a second latch structure that is attached to the door, the second latch structure including a third latch and a fourth latch; and
- a support structure that includes a first latch receiving assembly that is configured to receive the first latch, a second latch receiving assembly that is configured to receive the second latch, a third latch receiving assembly that is configured to receive the third latch and a fourth latch receiving assembly that is configured to receive the fourth latch; wherein the first latch and the first latch receiving assembly are configured to act as a first hinge and the second latch and the second latch receiving assembly are configured to act as a second hinge when the third latch is removed from the third latch receiving assembly and the fourth latch is removed from the fourth latch receiving assembly, and the third latch and the third latch receiving assembly are configured to act as a third hinge and the fourth latch and the fourth latch receiving assembly are configured to act as a fourth hinge when the first latch is removed from the first latch receiving assembly and the second latch is removed from the second latch receiving assembly;
- wherein each of the first through fourth latch receiving assemblies are at least partially moveable.

11. The communications cable management system of claim 10, wherein:
- the first latch receiving assembly comprises a first hinge bracket that includes a first opening that is configured to receive the first latch;
- the second latch receiving assembly comprises a second hinge bracket that includes a second opening that is configured to receive the second latch;
- the third latch receiving assembly comprises a third hinge bracket that includes a third opening that is configured to receive the third latch; and
- the fourth latch receiving assembly comprises a fourth hinge bracket that includes a fourth opening that is configured to receive the fourth latch.

12. The communications cable management system of claim 11, wherein:
- the first hinge bracket includes a mounted portion that is fixedly mounted to the support structure and an elastically mobile portion that includes the first opening;
- the second hinge bracket includes a mounted portion that is fixedly mounted to the support structure and an elastically mobile portion that includes the second opening;
- the third hinge bracket includes a mounted portion that is fixedly mounted to the support structure and an elastically mobile portion that includes the third opening; and
- the fourth hinge bracket includes a mounted portion that is fixedly mounted to the support structure and an elastically mobile portion that includes the fourth opening.

13. The communications cable management system of claim 11, wherein each of the first through fourth hinge brackets includes a striker plate that is positioned so as to define an acute angle with respect to a longitudinal axis defined by a respective one of the first through fourth latches.

14. The communications cable management system of claim 10, wherein each of the first through fourth latch receiving assemblies comprises a bracket that includes a slot that has an opening that is configured to receive a respective one of the first through fourth latches, a latch member that has an arm that is moveable between a first position in which the arm captures the respective one of the first through fourth latches within the slot and a second position in which the arm allows access to the slot, and a spring that biases the arm of the latch member toward the first position.

15. The communications cable management system of claim 14, wherein:
- when the first, second, third and fourth latches are in their latched positions, the door is secured in a closed position on the support structure;
- when the first, second, third and fourth latches are in their unlatched positions, the door can be removed from the support structure;
- when the first and second latches are in their latched positions and the third and fourth latches are in their unlatched positions, the door can be pivoted open about the first pivot axis; and
- when the third and fourth latches are in their latched positions and the first and second latches are in their unlatched positions, the door can be pivoted open about the second pivot axis.

16. A communications cable management system comprising:
- a cable trough having an at least partially exposed side;
- a door having first and second opposed side edges that covers at least a portion of the exposed side of the cable trough;
- a first latch that is attached to the door;
- a second latch that is attached to the door; and
- a support structure that includes:
  - a first hinge bracket that includes a first opening that is configured to receive the first latch and a first striker plate that is positioned between a front surface of the door and the first opening; and
  - a second hinge bracket that includes a second opening that is configured to receive the second latch and a second striker plate that is positioned between the front surface of the door and the second opening;
- wherein the first latch is selectively positionable between a latched position in which the first latch is received in the first opening in the first hinge bracket to secure the door to the support structure for pivotal movement about a first pivot axis proximate the first side edge of the door, and an unlatched position in which the first latch is removed from the first opening in the first hinge bracket to permit the first side edge of the door to be separated from the support structure; and
- wherein the second latch is selectively positionable between a latched position in which the second latch is received in the second opening in the second hinge bracket to secure the door to the support structure for pivotal movement about a second pivot axis proximate the second side edge of the door, and an unlatched position in which the second latch is removed from the second opening in the second hinge bracket to permit the second side edge of the door to be separated from the support structure.

17. The communications cable management system of claim 16, wherein the first hinge bracket includes a mounted portion that is fixedly mounted to the support structure and an elastically mobile portion that includes the first opening, wherein the first striker plate is part of the elastically mobile portion of the hinge bracket, and wherein the first striker plate is positioned so as to define an acute angle with respect to a longitudinal axis of the first latch.

* * * * *

UNITED STATES PATENT AND TRADEMARK OFFICE
CERTIFICATE OF CORRECTION

PATENT NO. : 8,220,881 B2
APPLICATION NO. : 12/268721
DATED : July 17, 2012
INVENTOR(S) : Keith It is certified that error appears in the above-identified patent and that said Letters Patent is hereby corrected as shown below:

On the Title Page:
Item (73) Assignee: Please correct "CommScope, Inc., Hickory, NC (US)"
to read -- CommScope, Inc. of North Carolina, Hickory, NC (US) --

Signed and Sealed this
Ninth Day of April, 2013

Teresa Stanek Rea
*Acting Director of the United States Patent and Trademark Office*